(12) United States Patent
Shiomi

(10) Patent No.: US 11,575,323 B2
(45) Date of Patent: Feb. 7, 2023

(54) RECTIFIER CIRCUIT, POWER SOURCE DEVICE, AND METHOD FOR DRIVING RECTIFIER CIRCUIT

(71) Applicant: SHARP KABUSHIKI KAISHA, Sakai (JP)

(72) Inventor: Takeshi Shiomi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 67 days.

(21) Appl. No.: 17/258,441

(22) PCT Filed: Jun. 25, 2019

(86) PCT No.: PCT/JP2019/025241
§ 371 (c)(1),
(2) Date: Jan. 7, 2021

(87) PCT Pub. No.: WO2020/017260
PCT Pub. Date: Jan. 23, 2020

(65) Prior Publication Data
US 2021/0281178 A1    Sep. 9, 2021

(30) Foreign Application Priority Data

Jul. 19, 2018   (JP) .............................. JP2018-136200

(51) Int. Cl.
*H02M 3/158*   (2006.01)
*H02M 1/00*    (2006.01)
(Continued)

(52) U.S. Cl.
CPC .... *H02M 3/1584* (2013.01); *G01R 19/16538* (2013.01); *H02M 1/0009* (2021.05);
(Continued)

(58) Field of Classification Search
CPC .......... H02M 3/02; H02M 3/04; H02M 3/003; H02M 3/135; H02M 3/137; H02M 3/142;
(Continued)

(56) References Cited

U.S. PATENT DOCUMENTS

2013/0152624 A1   6/2013   Arisawa et al.
2021/0281185 A1*  9/2021   Shiomi ............. H02M 3/33592

FOREIGN PATENT DOCUMENTS

JP   2011019358 A   1/2011
JP   2011036075 A   2/2011
(Continued)

OTHER PUBLICATIONS

English translation of JP2013198298. (Year: 2013).*

*Primary Examiner* — Thienvu V Tran
*Assistant Examiner* — Carlos O Rivera-Perez
(74) *Attorney, Agent, or Firm* — ScienBiziP, P.C.

(57) ABSTRACT

A transient current in a rectifier circuit is efficiently reduced. In a rectifier circuit, a first rectifier is provided between the first terminal and a second terminal. In the rectifier circuit, when a switch element is turned ON, a primary winding current flows from a power source to a primary winding in a transformer. When the switch element is turned OFF, a second rectifier current flows from a secondary winding in the transformer to a second rectifier. When the second rectifier current flows, a first reverse voltage is applied between the first terminal and the second terminal. The first reverse voltage is a reverse voltage applied instantaneously.

7 Claims, 10 Drawing Sheets

(51) Int. Cl.
*H02M 1/32* (2007.01)
*H02M 3/00* (2006.01)
*G01R 19/165* (2006.01)
*H02M 3/335* (2006.01)
*H02M 7/217* (2006.01)

(52) U.S. Cl.
CPC ......... *H02M 1/0051* (2021.05); *H02M 1/325* (2021.05); *H02M 3/003* (2021.05); *H02M 3/33592* (2013.01); *H02M 7/217* (2013.01)

(58) Field of Classification Search
CPC .. H02M 3/155; H02M 3/1552; H02M 3/1555; H02M 3/156; H02M 3/1566; H02M 3/158; H02M 3/1584; H02M 3/1588; H02M 3/22; H02M 3/24; H02M 3/315; H02M 3/3155; H02M 3/335; H02M 3/33507; H02M 3/33523; H02M 3/3353; H02M 3/33569; H02M 3/33576; H02M 3/33584; H02M 3/33592; H02M 1/0009; H02M 1/0048; H02M 1/0051; H02M 1/0054; H02M 1/0058; H02M 1/32; H02M 1/325; H02M 1/34; H02M 1/342–348; H02M 7/02; H02M 7/04; H02M 7/062; H02M 7/155; H02M 7/21; H02M 7/217; G01R 19/16538; Y02B 70/10
USPC ........ 323/222–226, 235, 238, 266, 271–275, 323/282–287, 351; 363/15–21.18, 101, 363/123–134
See application file for complete search history.

(56) References Cited

FOREIGN PATENT DOCUMENTS

| | | |
|---|---|---|
| JP | 2012070580 A | 4/2012 |
| JP | 2013198298 A | 9/2013 |

* cited by examiner

RECTIFIER CIRCUIT, POWER SOURCE DEVICE, AND METHOD FOR DRIVING RECTIFIER CIRCUIT

TECHNICAL FIELD

The following disclosure relates to a rectifier circuit.

BACKGROUND ART

A rectifier circuit provided to a power source circuit uses such a rectifier as a metal-oxide semiconductor field-effect transistor (MOSFET), or a first recovery diode (FRD). This rectifier includes a diode having a PN junction.

Hence, when a reverse voltage is applied to the rectifier, electric charges stored in the PN junction flow in the form of a transient current through the rectifier. This transient current is also referred to as a reverse recovery current. The transient current causes loss in the power source circuit.

Patent Documents 1 and 2 each disclose a circuit a purpose of which is to reduce the transient current. For example, the circuit disclosed in the Patent Document 1 includes a diode and a transformer connected in parallel to a semiconductor switching element to reduce a transient current. Patent Document 2 also discloses a circuit similar to that of Patent Document 1.

CITATION LIST

Patent Literature

[Patent Document 1] Japanese Unexamined Patent Application Publication No. 2011-036075
[Patent Document 2] Japanese Unexamined Patent Application Publication No. 2013-198298

SUMMARY OF INVENTION

Technical Problem

There is still room for improvement in the technique of reducing a transient current in a rectifier circuit as will be described later in detail. The present disclosure, in an aspect thereof, has an object to effectively reduce a transient current in a rectifier circuit.

Solution to Problem

In order to solve the above problem, a rectifier circuit according to an aspect of the present disclosure includes a first terminal; and a second terminal. With reference to the first terminal, a positive voltage to be applied to the second terminal is a forward voltage. With reference to the second terminal, a positive voltage to be applied to the first terminal is a reverse voltage. If the forward voltage is continuously applied, a forward rectifier circuit current flows from the second terminal to the first terminal. If the reverse voltage is continuously applied, the forward rectifier circuit current is blocked. The rectifier circuit further includes: a first rectifier connected to the first terminal and the second terminal; a transformer including a primary winding and a secondary winding; a second rectifier connected in parallel to the first rectifier through the secondary winding; a switch element connected to the primary winding; and a power source connected to the primary winding. When the switch element is turned ON, a primary winding current flows from the power source to the primary winding. When the switch element is turned OFF, a second rectifier current flows from the secondary winding to the second rectifier. When the second rectifier current flows, a first reverse voltage is applied, the first reverse voltage being the reverse voltage applied instantaneously.

Moreover, in order to solve the above problem, a method according to an other aspect of the present disclosure is for driving a rectifier circuit. The rectifier circuit includes: a first terminal; and a second terminal. In the rectifier circuit, with reference to the first terminal, a positive voltage to be applied to the second terminal is a forward voltage. With reference to the second terminal, a positive voltage to be applied to the first terminal is a reverse voltage. If the forward voltage is continuously applied, a forward rectifier circuit current flows from the second terminal to the first terminal. If the reverse voltage is continuously applied, the forward rectifier circuit current is blocked. The rectifier circuit includes: a first rectifier connected to the first terminal and the second terminal; a transformer including a primary winding and a secondary winding; a second rectifier connected in parallel to the first rectifier through the secondary winding; a switch element connected to the primary winding; and a power source connected to the primary winding. The method includes: applying the forward voltage, so that the forward rectifier circuit current flows; turning the switch element ON after the applying the forward voltage, so that a primary winding current flows from the power source to the primary winding; turning the switch element OFF after the turning the switch element ON, so that a second rectifier current flows from the secondary winding to the second rectifier, and that a first reverse voltage is applied, the first reverse voltage being the reverse voltage applied instantaneously; and applying a second reverse voltage after the turning the switch element OFF, the second reverse voltage being the reverse voltage applied continuously.

Advantageous Effects of Invention

A rectifier circuit according to an aspect of the present disclosure can effectively reduce transient current in a rectifier circuit. A method for driving a rectifier circuit according to an aspect of the present disclosure provides similar advantageous effects.

DESCRIPTION OF EMBODIMENTS

First Embodiment

Figure 1:
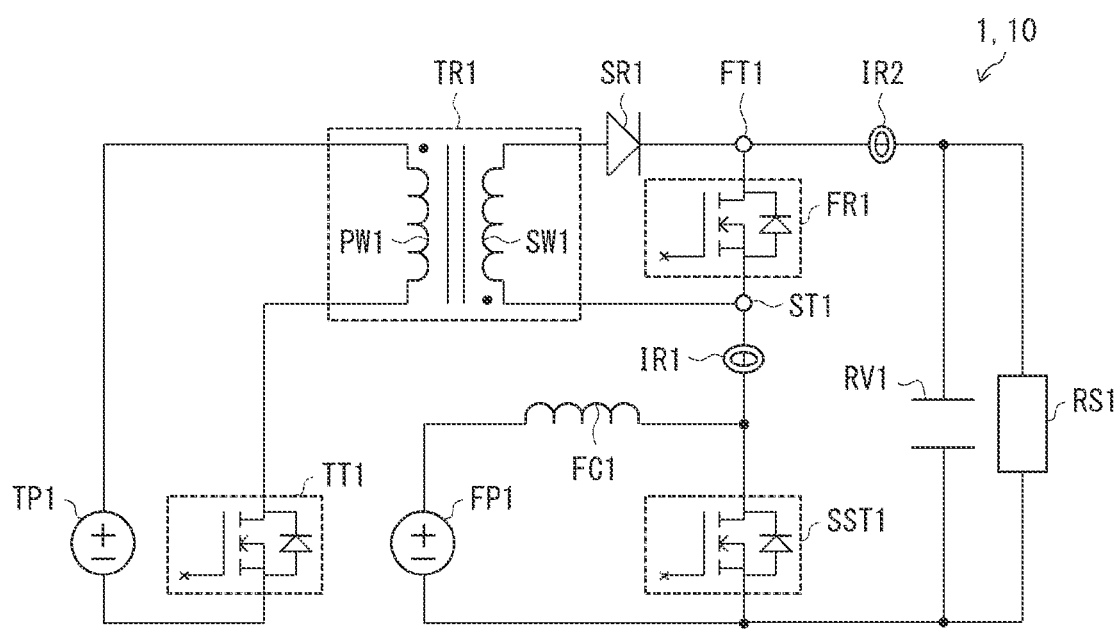
FIG. 1 is a circuit diagram of a power source circuit according to a first embodiment.

Described below is a rectifier circuit 1 of a first embodiment. For convenience of description, members of a second embodiment and any subsequent embodiments that have the same function as members described in the first embodiment will be indicated by the same reference numerals, and the description thereof shall be omitted.

Purpose of Rectifier Circuit 1

As described above, a rectifier having a PN junction conducts a transient current. Meanwhile, there is an other rectifier made of a compound semiconductor with no PN junction. An example of such a rectifier includes a SiC-Schottky barrier diode (SBD) or a GaN-high electron mobility transistor (HEMT). The rectifier does not generate a transient current due to the PN junction.

The rectifier, however, has parasitic capacitance. Hence, when a voltage is applied to the rectifier in a direction to stop a current, a current flows as a transient current through the rectifier to store the parasitic capacitance. The rectifier circuit 1 is newly created by an inventor of the present application (hereinafter the inventor) for the purpose of reducing the transient current.

DEFINITION OF TERMS

Various terms used in DESCRIPTION are defined below prior to a description of the rectifier circuit 1.

A forward voltage is a voltage to make a rectifier conductive. For example, when the rectifier is a diode, a forward voltage is applied to the diode such that the diode conducts a forward current.

Consider, as another example, a case where the rectifier is a MOSFET or a GaN-HEMT. That is, consider a case where the rectifier includes a gate (a gate terminal), a source (a source terminal), and a drain (a drain terminal). The forward voltage in such a case is a positive voltage to make the rectifier conductive if the voltage is applied to the source with reference to the drain when the gate is OFF (when a voltage of the gate is below or equal to a threshold voltage). For example, the GaN-HEMT may be of either a cascode type, or an E-mode (a normally-off) type.

In this Description, the forward voltage is continuously applied unless otherwise defined. For example, a forward voltage in a duty cycle corresponds to the forward voltage to be continuously applied. An instantaneous voltage such as noise generated of, for example, a parasitic component does not corresponds to the forward voltage to be continuously applied.

Note that the forward voltage is also referred to as a positive voltage to be applied to a second terminal (to be described later) of the rectifier circuit with reference to a first terminal (to be described later) of the rectifier circuit. A current to flow in the rectifier circuit in accordance with the application of the forward voltage is referred to as a forward current of the rectifier circuit. As will be seen below, the forward current may also be referred to as a rectification current.

A reverse voltage is a voltage to make the rectifier non-conductive. When the reverse voltage is applied to the rectifier, the rectifier does not conduct the forward current. For example, if the rectifier is a diode, the reverse voltage is applied to the diode to keep the diode from conducting the forward current.

Consider, as another example, a case where the rectifier is a MOSFET or a GaN-HEMT. The reverse voltage in such a case is a positive voltage to be applied to the drain with reference to the source when the gate is OFF (when a voltage of the gate is below a threshold voltage). The reverse voltage to be applied to the rectifier can keep a main current from flowing in the rectifier.

In this Description, the reverse voltage is continuously applied unless otherwise defined. For example, a reverse voltage in a duty cycle corresponds to the reverse voltage to be continuously applied. In this DESCRIPTION, a "second reverse voltage" to be described later is the continuous reverse voltage. In contrast, a "first reverse voltage" to be described later is an instantaneous reverse voltage, and thus should be interpreted separately from a common reverse voltage (the continuous reverse voltage).

Note that the reverse voltage is also referred to as a positive voltage to be applied to the first terminal with reference to the second terminal. When the reverse voltage is continuously applied to the first terminal, the rectifier does not conduct a forward current.

A transient current is a collective term for (i) a reverse recovery current and (ii) a charge current due to a parasitic capacitance of the rectifier. In other words, the transient current is transiently generated when a reverse voltage is applied to the rectifier. The amount (the level) of the transient current increases in such cases where, for example, the parasitic capacitance increases, the reverse recovery current increases, and the reverse voltage rises. This transient current causes loss in the circuit. In the rectifier circuit 1 illustrated in FIG. 1, the transient current can be measured at an IR1 and an IR2 to be described later.

A rectification function is to allow a current to flow (run) in only a certain direction (one direction), and to keep the current from flowing in a direction opposite to the certain direction (to block the current). For example, when the rectifier is a diode, the diode (i) allows a forward current to flow therethrough and (ii) blocks a reverse current. Such a function of the diode is an example of the rectification function.

Consider, as another example, a case where the rectifier is a MOSFET or a GaN-HEMT. When the gate is OFF, the rectifier in such a case allows a current to flow from the source to the drain, and blocks a current flowing from the drain to the source. When the rectifier is a MOSFET or a GaN-HEMT, the rectification function may be provided with (i) the source replaced with the anode (the anode terminal) of the diode, and (ii) the drain replaced with the cathode (the cathode terminal) of the diode. Hence, in the description of the rectifier below, the terms "source" and "drain" are respectively replaced with the terms "anode" and "cathode" as deemed appropriate.

A rectifier is a collective term for elements capable of the rectification function. The diode, the MOSFET, and the GaN-HEMT described above are an example of the rectifier. When the rectifier is the diode, (i) the cathode is connected to the first terminal of the rectifier circuit, and (ii) the anode is connected to the second terminal of the rectifier circuit. Note that the term "connection" in DESCRIPTION means "electrical connection" unless otherwise specified.

In connecting together (i) the cathode and the first terminal, and (ii) the anode and the second terminal, an element (including a winding of a transformer) may be interposed therebetween as necessary.

A rectification current is a forward current flowing in the rectifier or the rectifier circuit. In the rectifier circuit 1 illustrated in FIG. 1, the rectification current can be measured at the IR1 and the IR2.

A switch function (switching function) is to select whether the current flows from the drain to the source of an element only by ON and OFF of the gate of the element. The element having the switch function is referred to as a switch element (a switching element). Examples of the switch element include a MOSFET, a GaN-HEMT, and an insulated gate bipolar transistor (IGBT).

Brief Description of Rectification Function of Rectifier Circuit

Described below is a basic operation of a rectifier circuit according to an aspect of the present disclosure. Moreover, the rectifier circuit may include an additional function whose details may be omitted in DESCRIPTION. For example, the rectifier circuit may additionally include a synchronous rectification function. The rectifier circuit according to an aspect of the present disclosure includes the first terminal and the second terminal. The first and second terminals satisfy the two conditions below.

The first condition is that, if a positive voltage is applied to the second terminal with reference to the first terminal (i.e., if the forward voltage is applied), the rectification current (the forward current) flows in the rectifier circuit. The first condition is equivalent to the forward characteristic of a diode. For example, when a low forward voltage of approximately 1 V is applied, a forward current in a predetermined amount (e.g., a current ranging in the order from 1 A to 100 A) can be generated. The amount of the forward current is significantly affected by such characteristics as a current value of the elements (e.g., a coil) to be provided to the circuit.

The second condition is that, if a positive voltage is applied to the first terminal with reference to the second terminal (i.e., if the reverse voltage is applied), the rectification current can be blocked in the rectifier circuit. The second condition is equivalent to the reverse characteristic of a diode. For example, even if a reverse voltage of approximately 400 V is applied, a reverse current to flow is small in amount (e.g. a current ranging in the order from 1 nA to 1 µA). As a matter of course, the second condition excludes a high voltage exceeding breakdown voltage characteristics of the elements of the rectifier circuit.

Hence, the characteristics between the first and second terminals of the rectifier circuit according to an aspect of the present disclosure are equivalent to those between the anode and the cathode of a diode. Specifically, the first terminal is equivalent to the cathode, and the second terminal is equivalent to the anode.

The rectifier circuit according to an aspect of the present disclosure includes: a first rectifier (e.g., an FR1); and a second rectifier (e.g., an SR1). As an example, if the first rectifier is a MOSFET, a GaN-HEMT, or an IGBT with diodes connected thereto in inverse parallel, the rectifier circuit per se can be used as a switch element. In such a case, the rectifier circuit is applicable to, for example, a bi-directional chopper circuit, an inverter circuit, or a totem pole power factor correction (PFC) circuit.

Outline of Power Source Circuit 10

FIG. 1 is a circuit diagram of a power source circuit 10. The power source circuit 10 includes the rectifier circuit 1. (Also see FIG. 11.) An example of the power source circuit 10 is a step-up chopper circuit. The rectifier circuit 1 acts as a rectifier of the power source circuit 10. The power source circuit 10 is a known power source circuit whose rectifier is replaced with the rectifier circuit 1. The following description includes numerical values for explanatory purposes only. Described first are main constituent features of the power source circuit 10 except the rectifier circuit 1.

Outline of Power Source Circuit 10: Input Unit

The power source circuit 10 includes a power source FP1 and a coil FC1 cooperating as an input unit. The power source FP1 is an input power source of the power source circuit 10 (a step-up chopper circuit). The power source FP1 has a voltage (an input voltage) of 200 V. The circuit symbol (+) illustrated in FIG. 1 denotes a positive electrode of the power source FP1. The positive electrode of the power source FP1 has a voltage (more specifically, a potential) of 200 V. The circuit symbol (−) denotes a negative electrode of the power source FP1. The negative electrode of the power source FP1 has a voltage of 0 V.

The coil FC1 is a step-up coil of the power source circuit 10. Hereinafter, a current to flow through the coil FC1 is referred to as a coil current. When the power source circuit 10 is in a steady state (hereinafter simply referred to as a steady state), the coil current is an average value of 14 A. The coil FC1 has an inductance of 500 µH.

Outline of Power Source Circuit 10: Output Unit

The power source circuit 10 includes a load RS1 and a capacitor RV1 cooperating as an output unit. The load RS1 is connected to the output of the power source circuit 10. In the steady state, the load RS1 consumes a power of approximately 2,800 W.

The capacitor RV1 is a smoothing capacitor to the output of the power source circuit 10. A positive electrode of the capacitor RV1 is the upper electrode in the diagram of FIG. 1. In the steady state, the positive electrode of the output unit (i.e., the positive electrode of the capacitor RV1) has a voltage of 400 V. As can be seen, the power source circuit 10 is designed so that the output voltage is twice as high as the input voltage. The capacitor RV1 has a capacitance of 3.3 mF.

Outline of Power Source Circuit 10: Switch

The power source circuit 10 further includes a switch element SST1 as a switch. The switch element SST1 excites the coil FC1, and functions as a switch to increase a coil current. In the steady state, the switch element SST1 turns ON when the duty cycle is 50%. The switch element SST1 has a drive frequency of 100 kHz. Thus, a forward voltage and a reverse voltage are alternately applied to the rectifier circuit 1 when the duty cycle is 50%.

In the example of FIG. 1, the switch element SST1 is the same element as the first rectifier FR1. When the gate is turned ON, the switch element SST1 allows a current to flow from the drain to the source. Moreover, when the gate is turned OFF, the switch element SST1 blocks the current.

Outline of Power Source Circuit 10: Rectifier Circuit 1

Described next are constituent features of the rectifier circuit 1. The rectifier circuit 1 includes: a first rectifier FR1; a second rectifier SR1; a transformer TR1: a switch element TT1; a power source TP1; a first terminal FT1; and a second terminal ST1.

The first rectifier FR1 is an example of the above first rectifier. The first rectifier FR1 is a cascode of the high-breakdown-voltage GaN-HEMT and the low-breakdownvoltage Si-MOSFET. Such a GaN-HEMT is also referred to as a cascode GaN-HEMT. In the example of FIG. 1, the cascode GaN-H EMT is illustrated by the same circuit symbol as that of the MOSFET.

The cascode GaN-HEMT and the MOSFET have the same rectification function. Furthermore, both the cascode GaN-HEMT and the MOSFET can carry out synchronous rectification. Note that the cascode GaN-HEMT and the MOSFET generate a different amount of transient current.

The cascode GaN-HEMT to be used as the first rectifier FR1 has a reverse breakdown voltage of 650 V. Furthermore, the cascode GaN-HEMT has an ON resistance of 50 mΩ. The GaN-HEMT can stand a relatively high voltage for a short period of time. Hence, the cascode GaN-HEMT can stand a voltage up to 800 V within 1 psec.

The second rectifier SR1 is an example of the above second rectifier. In the example of FIG. 1, the second rectifier SR1 is a SiC-SBD. The second rectifier SR1 has a breakdown voltage of 650 V. Furthermore, the second rectifier SR1 has a forward voltage of 0.9 V when starting to conduct a current. The second rectifier SR1 has a resistance of 50 mΩ when conducting a forward current. The second rectifier SR1 is connected in parallel to the first rectifier FR1 through a secondary winding SW1 to be described later.

The transformer TR1 includes: a primary winding PW1; and the secondary winding SW1. The primary winding PW1 is formed into nine turns. The primary winding PW1 has an inductance of 1.6 μH. The primary winding PW1 has a resistance of 10 mΩ. The inductance of the primary winding PW1 is also referred to as an excitation inductance. The transformer TR1 can store energy in the primary winding PW1. The secondary winding SW1 is formed into six turns. The secondary winding SW1 has a resistance of 7 mil.

The switch element TT1 is connected to the primary winding PW1. The switch element TT1 is the same element as the first rectifier FR1. Note that, like the switch element SST1, the switch element TT1 is also used exclusively as a switch.

The gate terminals of the elements are all connected to a control circuit. Specifically, the gate terminals (the gates) included in the rectifiers and the switch elements provided to the power source circuit 10 are connected to a control circuit 8 (a controller) to be described later. The control circuit 8 is not shown in such a drawing as FIG. 1. See FIG. 11. The gates are switched ON and OFF by the control circuit 8. This feature is the same in the second embodiment and any subsequent embodiments.

The power source TP1 is connected to the primary winding PW1. The power source TP1 has a voltage of 15 V. The circuit symbol (+) illustrated in FIG. 1 denotes a positive electrode of the power source TP1. The positive electrode of the power source TP1 has a voltage of 15 V. The circuit symbol (−) denotes a negative electrode of the power source TP1. The negative electrode of the power source TP1 has a voltage of 0 V.

The first terminal FT1 is an example of the above first terminal. In the rectifier circuit 1, the path branches out with reference to the first terminal FT1 into a path to the first rectifier FR1 and a path to the secondary winding SW1. The first terminal FT1 is connected to the cathode of the second rectifier SR1. The first terminal FT1 is connected to the secondary winding SW1 through the second rectifier SR1. Furthermore, the first terminal FT1 is connected to the cathode of the first rectifier FR1. The first terminal FT1 is connected to the second terminal ST1 through the first rectifier FR1.

The second terminal ST1 is an example of the above second terminal. In the rectifier circuit 1, the path further branches out with reference to the second terminal ST1 into a path to the first rectifier FR1 and a path to the secondary winding SW1. The second terminal ST1 is connected to the secondary winding SW1. The second terminal ST1 is connected to the anode of the second rectifier SR1 through the secondary winding SW1. Furthermore, the second terminal ST1 is connected to each of (i) the anode of the first rectifier FR1, and (ii) the drain of the switch element SST1.

In the example of FIG. 1, the second rectifier SR1 is disposed closer to the first terminal FT1, and the secondary winding SW1 is disposed closer to the second terminal ST1. Note that such an arrangement is an example. In the rectifier circuit according to an aspect of the present disclosure, the second rectifier SR1 and the secondary winding SW1 may interchangeably be positioned.

Each of the IR1 and IR2 is a current measurer. The current measurers IR1 and IR2 can measure a rectification current of the rectifier circuit. Note that neither the current measurer IR1 nor the current measurer IR2 is a current sensor. A measurement result of the rectification current described in DESCRIPTION is a result of measurement by the current measurers IR1 and IR2. Both of the current measurers IR1 and IR2 measure the same current value. The rectification current can be measured by any given current sensor. That is, the rectification current may be measured by any given technique. Examples of such a technique include use of a hall element type current sensor, a current transformer (CT) sensor, and a combination of a Rogowskii coil and a shunt resistor. In DESCRIPTION, as to a direction of a current to be measured (a detection direction) by the current measurers IR1 and IR2, the current flowing from the second terminal ST1 toward the first terminal FT1 is a positive current. The current measurers IR1 and IR2 can also measure the transient current. This transient current is measured as an instantaneous negative current.

Configuration and Basic Operations (1 to 3) of Step-Up Chopper Circuit of Comparative Example Studied below is a step-up chopper circuit of a comparative example; namely, a typical step-up chopper circuit. The step-up chopper circuit of the comparative example is referred to as a power source circuit 10r. The power source circuit 10r includes: the power source FP1; the coil FC1; the switch element SST1; the first rectifier FR1; the capacitor RV1; and the load RS1.

In the power source circuit 10r, the first rectifier FR1 is the only rectifier circuit. For the comparison with the power source circuit 10, the first rectifier FR1 in the description of the power source circuit 10r is referred to as the rectifier circuit. Described below in detail are operations of the power source circuit 10r and a relationship between a reverse voltage and a transient current in the rectifier circuit of the power source circuit 10r.

(1)

First, in an ON period of the switch element SST1, a drain voltage of the switch element SST1 and an anode voltage of the first rectifier FR1 are approximately 0 V. The cathode of the first rectifier FR1 is connected to the positive electrode (a voltage of 400 V) of the capacitor RV1. Hence, a reverse voltage of 400 V is applied to the first rectifier FR1.

The coil FC1 has one terminal connected to the positive electrode (a voltage of 200 V) of the power source FP1. The coil FC1 has an other terminal connected to the drain (a voltage of approximately 0 V) of the switch element SST1. Hence, a voltage of approximately 200 V is applied to the coil FC1. The voltage applied to the coil FC1 increases the coil current as time passes. The coil current flows through a path from the positive electrode of the power source FP1, to the coil FC1, to the switch element SST1, and to the negative electrode of the power source FP1.

(2)

Next, the switch element SST1 is switched from ON to OFF. When the switch element SST is switched to OFF, a parasitic capacitance of the switch element SST1 is stored. As a result, the drain voltage of the switch element SST1 rises. When the drain voltage exceeds the voltage (400 V) of the positive electrode of the capacitor RV1, a forward voltage is applied to the first rectifier FR1. As a result, a forward current flows in the first rectifier FR1.

As an example, consider a case where the drain voltage of the switch element SST1 rises approximately to 401 V. Here, in the first rectifier FR1, the anode has a voltage of approximately 401 V and the cathode has a voltage of 400 V. Hence, a forward voltage of approximately 1 V is applied to the first rectifier FR1. Along with the application of the forward voltage, the first rectifier FR1 conducts a rectification current.

(3)

After that, the switch element SST1 is switched from OFF to ON. When the switch element SST1 is switched to ON, the drain voltage of the switch element SST1 falls. Along with the fall of the drain voltage, the anode voltage of the rectifier FR1 also falls. Meanwhile, the cathode voltage of the first rectifier FR1 is kept fixed to 400 V. This is because the cathode of the first rectifier FR1 is connected to the positive electrode of the capacitor RV1. Hence, along with the fall of the drain voltage of the switch element SST1, a reverse voltage is applied to the first rectifier FR1. As a result, a transient current flows in the first rectifier FR1.

When the transient current finishes flowing, the drain voltage of the switch element SST1 falls approximately to 0 V. Moreover, to the first rectifier FR1, a reverse voltage of 400 V is applied.

The switch element SST1 alternately turns ON and OFF repeatedly at a drive frequency of 100 kHZ (i.e., a cycle of 10 μsec) when the duty cycle is 50%. Thus, a forward voltage and a reverse voltage are alternately applied to the first rectifier FR1 for every 5 usec.

Example of Operation of Rectifier Circuit 1

Figure 2:
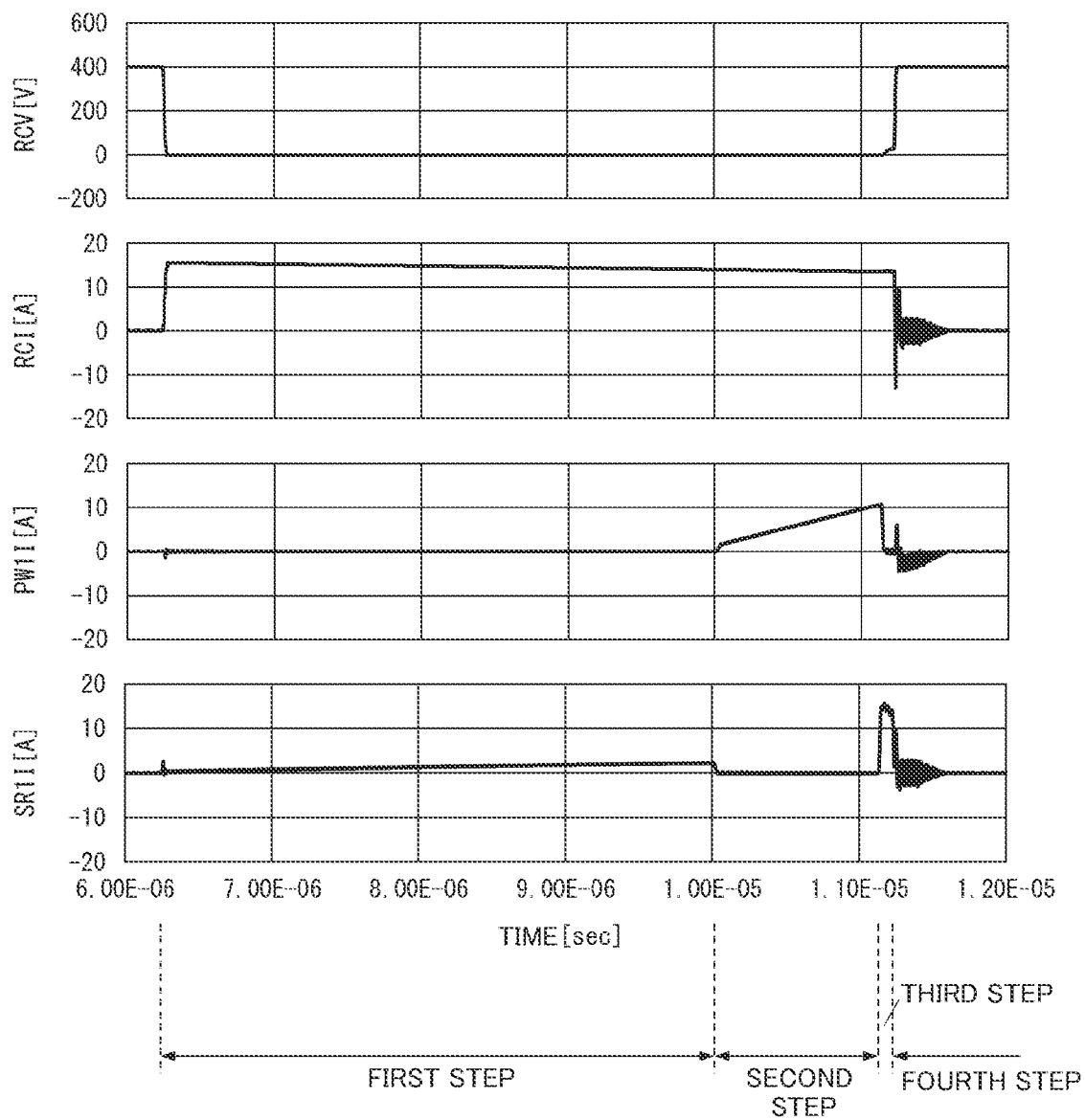
FIG. 2 is a set of diagrams of voltage and current waveforms.

Described below is an example of an operation of the rectifier circuit 1, with reference to FIGS. 2 to 4. FIG. 2 is a set of graphs illustrating voltage and current waveforms of the rectifier circuit 1. FIG. 2 illustrates four waveforms along a common time scale (a horizontal axis). Moreover, the horizontal axis shows time periods for a first step to a fourth step to be described below.

A voltage and currents illustrated in FIG. 2 include the following:
 a rectifier circuit voltage (RCV) is applied to the first terminal FT1 with reference to the second terminal ST1;
 a rectifier circuit current (RC1) flows from the second terminal ST1 to the first terminal FT1;
 a primary winding current (PW1I) flows from the power source TP1 to the primary winding PW1; and
 a second rectifier current (SR1I) flows through the second rectifier SR1 in a forward direction.

Figure 3:
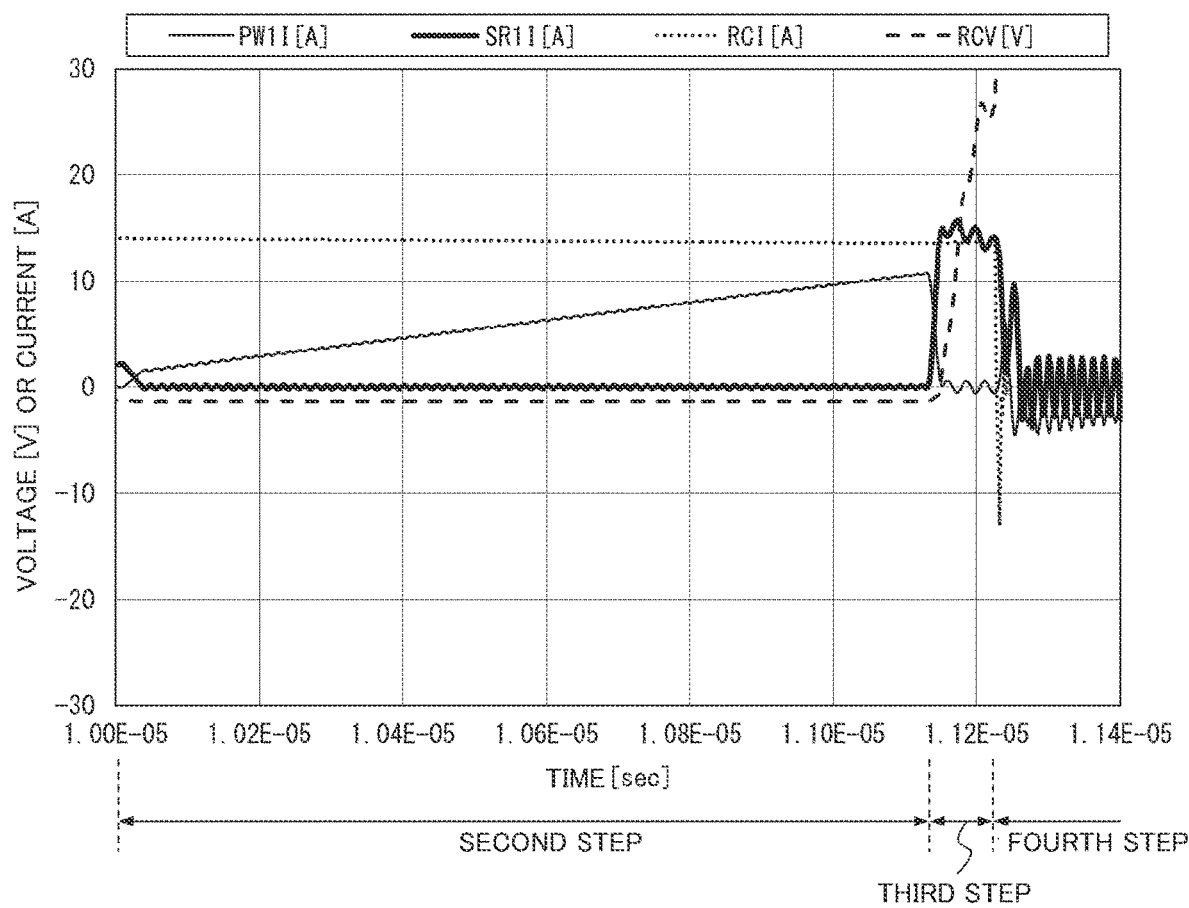
FIG. 3 is a diagram collectively showing the graphs in FIG. 2 on an enlarged scale.

FIG. 3 is a graph collectively showing the graphs in FIG. 2 on an enlarged scale. Unlike FIG. 2, FIG. 3 illustrates four waveforms in a single graph. For the sake of illustration on an enlarged scale, in FIG. 3, the RCV runs out of an upper end of the graph.

Figure 4:
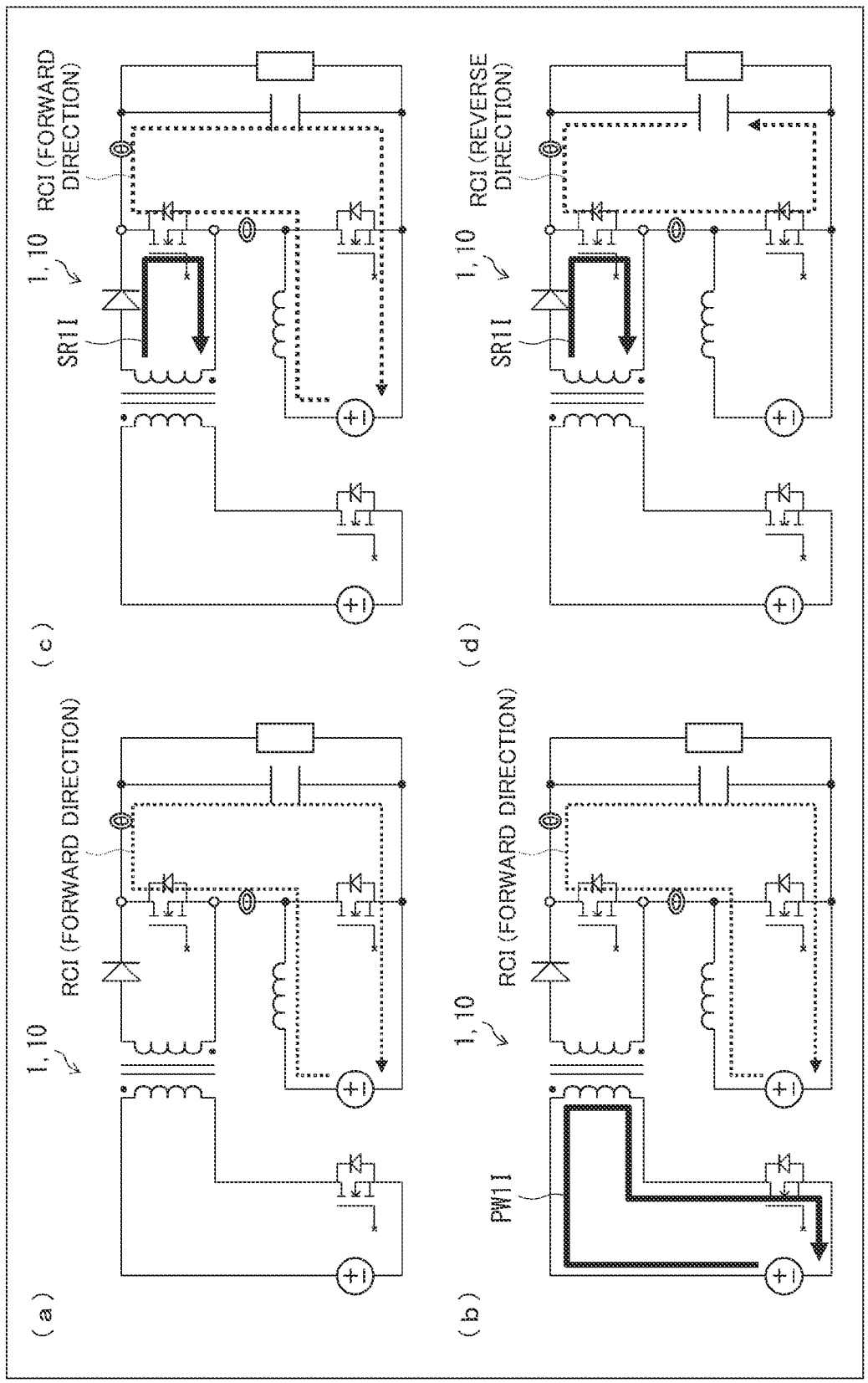
FIG. 4 is a set of diagrams (a) to (d) showing current paths in first to fourth steps.

FIG. 4 is a set of diagrams showing current paths in first to fourth steps. Specifically, the diagrams (a) to (d) in FIG. 4 illustrate respective current paths in the first to fourth steps. For the sake of illustration, FIG. 4 omits reference signs of the elements in FIG. 1 as appropriate. Moreover, compared with FIG. 1, FIG. 4 simplifies the illustration of each element.

Method for Driving Rectifier Circuit 1: First Step to Fourth Step and Connection of Transfer A method for driving (controlling) the rectifier circuit 1 involves the following four steps to be carried out in the stated order. The steps are specifically described below:
 A first step involves applying a forward voltage to the rectifier circuit 1, so that a rectification current flows in the rectifier circuit 1;
 A second step involves turning the switch TT1 ON, so that a current flows in the primary winding PW1;
 A third step involves turning the switch TT1 OFF, so that a current flows in the second rectifier SR1 and that a first reverse voltage is applied to the rectifier circuit; and
 A fourth step involves applying a second reverse voltage to the rectifier circuit 1, and stopping the rectification current.

First Step

Before the first step, a current flows from the coil FC1 toward the switch element SST1. Hence, in the first step, the switch element SST1 turns OFF so that the coil FC1 generates electromotive force. By the electromotive force, a forward voltage of approximately 1 V can be applied to the rectifier circuit 1. As a result, a rectification current (an RC1 in the forward direction) can flow in the rectifier circuit 1. The RC1 flows through the path illustrated in the diagram (a) of FIG. 4.

Note that, in the first step, the second rectifier SR1 conducts a smaller amount of current than the first rectifier FR1 does. This is because the second rectifier SR1 is connected in series to the secondary winding SW1. Specifically, the inductance of the secondary winding SW1 reduces the second rectifier current (SR1I). The value of this second rectifier current is relatively small, and, unlike the diagrams (c) to (d) in FIG. 4, the diagram (a) of FIG. 4 omits an illustration of the SR1.

Second Step

After the rectification current flows in the rectifier circuit 1, the switch element TT1 is turned ON. When the switch element TT1 is turned ON, the PW1I can be generated. The PW1I flows through the path illustrated in the diagram (b) of FIG. 4. In the second step, the PW1I increases substantially linearly as time passes.

Third Step-1: Passing Current Through Second Rectifier

Subsequent to the second step, the switch element TT1 is turned OFF to stop the PW1I. That is, the PW1I falls approximately to 0 A. When the PW1I stops, the SR1I can flow. The SR1I flows through the path illustrated in the diagram (c) of FIG. 4.

The current path through which the SR1I flows may be described from a different point of view. Focusing in particular on the first rectifier FR1 in the diagram (c) of FIG. 4, the description is presented on a current flowing in the first rectifier FR1. The diagram (c) of FIG. 4 illustrates the RCI; namely, the rectification current (flowing upward in the position of the first rectifier FR1 in the diagram), and the SR1I; namely, the second rectifier current (flowing downward in the position of the first rectifier FR1 in the diagram). When these currents flow in opposite directions through the same path at the same time point, a difference is created between values of the two currents (current values) in the path. In the example of the diagram (c) in the FIG. 4, the current value of the RCI is smaller than that of the SR1I. Hence, the RCI is cancelled out by the SR1I.

Third Step-2: Applying First Reverse Voltage

Moreover, described below is a differential current between the SR1I and the RCI after the cancellation. The diagram (c) of FIG. 4 shows that the second rectifier current (the SR1I); that is, the differential current after the cancellation, flows downward in the position of the first rectifier FR1. That is, the SR1I flows in the reverse direction whereas the first rectifier FR 1 passes a forward current. Hence, a parasitic capacitance of the first rectifier FR1 can be stored by the differential current after the cancellation. In storing the parasitic capacity, an instantaneous reverse voltage (i.e., the first reverse voltage) can be applied to the first rectifier FR1. Note that the first reverse voltage is also referred to as an instantaneous reverse voltage to be generated by the flow of the second rectifier current in the third step.

This first reverse voltage is generated by the second rectifier current, and thus generates no transient current.

As an example, a period in which the instantaneous reverse voltage is applied (an instantaneous period) can be interpreted as a period shorter than 10% of the cycle at a driving frequency. In the period shorter than 10% of the cycle, the application of the first reverse voltage does not significantly affect an operation of the circuit, and the first reverse voltage is interpreted to be instantaneous. In contrast, the duty cycle in which the switch element SST1 is ON is longer than the 10% of the cycle, and thus can be interpreted to be continuous.

In the first embodiment, the switching frequency is 100 kHz (a cycle of 10 μsec), and a period of 1 μsec or shorter is interpreted to be instantaneous.

Fourth Step-1: Applying Second Reverse Voltage

Subsequent to the third step, the second reverse voltage is applied to the rectifier circuit 1. As described above, unlike the first reverse voltage, the second reverse voltage is a continuous reverse voltage (a common reverse voltage). In the fourth step, the second reverse voltage can be applied when the switch element SST1 is turned ON. Note that in the description below, common reverse voltages including the second reverse voltage are collectively referred to as reverse voltages. A reverse voltage can be applied by various techniques, depending on a kind of a power source circuit. The reverse voltage may be applied by a technique suitable to the kind of the power source circuit.

Upon the application of the reverse voltage (the second reverse voltage), generated is a transient current (the RCI in the reverse direction) for storing the parasitic capacitance of the first rectifier FR1. The transient current flows through the path of the RCI in the diagram (d) of FIG. 4. The transient current is reduced by advantageous effects of a fourth step-2 and a fourth step-3 described next.

Although not shown in the diagram (d) of FIG. 4, when the fourth step starts, a current flows through a path from the positive electrode of the power source FP1, to the coil FC1, to the switch element SST1, and to the negative electrode of the power source FP1.

Fourth Step-2: Advantageous Effects of Second Rectifier Current SR1I

In the rectifier circuit 1, the reverse RCI is not the only current for storing the parasitic capacitance of the first rectifier FR1. The SR1I generated in the third step also flows in the fourth step through the path for storing the parasitic capacitance of the first rectifier FR1 (see the diagram (d) of FIG. 4). That is, the parasitic capacitance can be stored by the SR1I and the RCI.

Hence, the value of the transient current (the RCI in the reverse direction) falls by the value of the second rectifier current (the SR1I) subtracted. Compared with a typical technique, such a feature can effectively reduce the transient current.

Fourth Step-3: Advantageous Effects of First Reverse Voltage

The reverse voltage to be continuously applied in the power source circuit 10 is 400 V (a value determined by the capacitor RV1). In contrast, the first reverse voltage (approximately 25 V) has already been applied in the third step, such that the rectifier circuit voltage (the RCV) has risen. Hence, a level of a reverse voltage to be additionally applied (i.e., a level of the second reverse voltage) is the difference (approximately 375 V) obtained when the first reverse voltage (approximately 25 V) is subtracted from 400 V. Compared with a typical technique, such a feature can effectively reduce the transient current.

Additional Comments on Connection of Transformer TR1

As to be described below, the transformer TR1 is provided as a member to store magnetic energy in the second step. Hence, in a period for the PW1I to flow, the secondary winding SW1 needs to be kept from conducting a current. Note that the exception of such a current is one caused by parasitic capacitance and not expected by a designer of the rectifier circuit 1.

Additional Comments on Connection of Trans Fonner TR1: Storing Magnetic Energy

When a positive voltage is applied to an end of the primary winding PW1 with a black dot, a positive voltage is generated on an end of the secondary winding SW1 with a black dot. The voltage is applied to the secondary winding SW1 from the end with the black dot toward an other end without the black dot. Note that, in the rectifier circuit 1, the second rectifier SR1 is interposed between the end with the black dot and the other end without the black dot of the secondary winding SW1. Hence, the SR1I does not flow. Such a feature allows the magnetic energy due to the PW1I to be stored in the primary winding PW1.

Additional Comments on Connection of Transformer TR1: Releasing Magnetic Energy

In the third step, the PW1I is blocked so that the magnetic energy stored in the primary winding PW1 generates reverse electromotive force in the secondary winding SW1. As a result, the polarity of a voltage to be applied to the secondary winding SW1 is reversed. Hence, the second rectifier SR1, which has received a reverse voltage, now receives a forward voltage. Such a feature makes it possible to pass the SR1I while the PW1I is blocked. Hence, in the rectifier circuit according to an aspect of the present disclosure, the transformer is connected in a manner not to simultaneously generate the PW1I and the SR1I.

Effects of Reducing Transient Current and Loss

Figure 5:
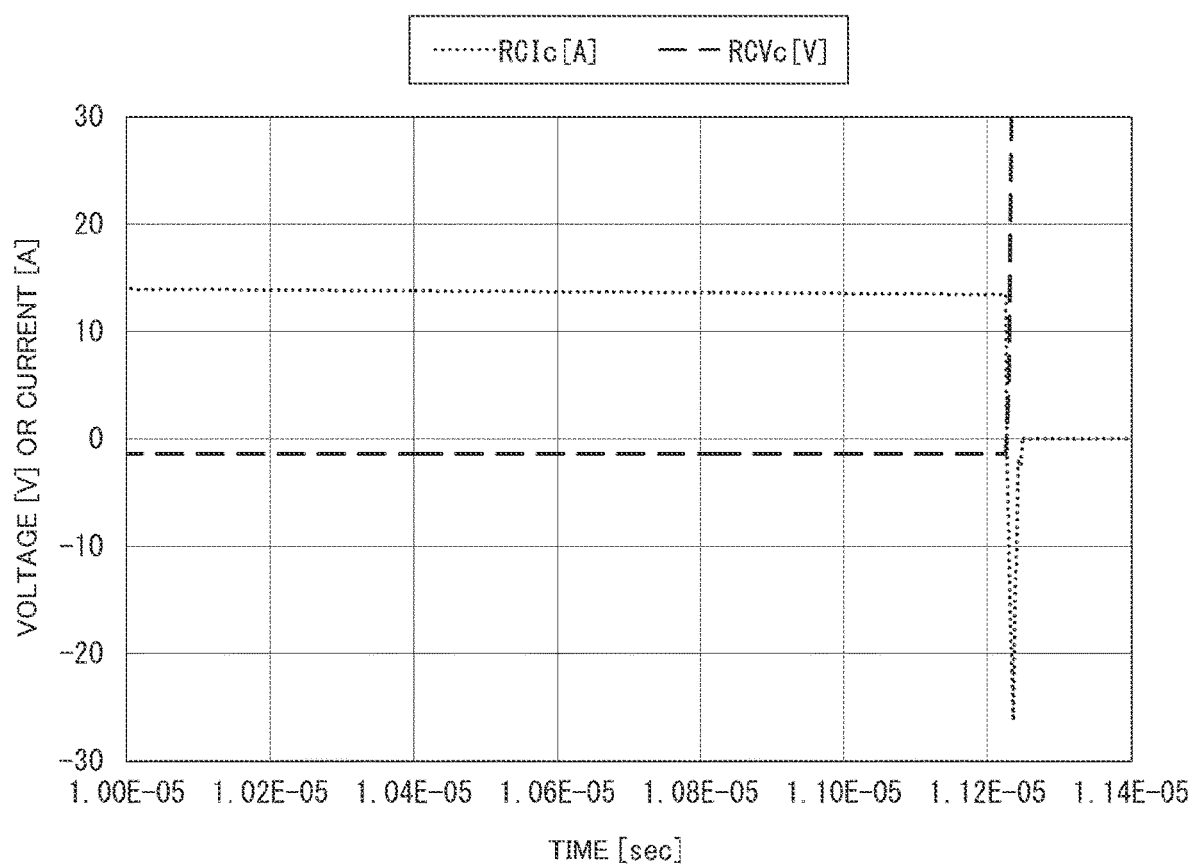
FIG. 5 is a diagram illustrating waveforms of a rectifier circuit voltage and a rectifier circuit current in a power source circuit according to a comparative example.

With reference to FIGS. 3 and 5, "effects of reducing transient current" and "effects of reducing loss" in the rectifier circuit 1 are described in the stated order. FIG. 5 is a graph illustrating waveforms of a rectifier circuit voltage (hereinafter an RCVc) and a rectifier circuit current (hereinafter RCIc) in the power source circuit 10r (the comparative example). The horizontal and vertical axes of the graph in FIG. 5 have the same scale as those in the graph in FIG. 3.

1. Effects of Reducing Transient Current

Comparative Example

Described here with reference to FIG. 5 is a transient current in a rectifier circuit (i.e., the first rectifier FR1) of the power source circuit 10r. The rectifier circuit conducts a transient current (a negative RCIc) when a reverse voltage (a positive RCVc) is applied to the rectifier circuit (see at around a time 1.12E-5). Because of the scale limitation of the vertical axis, FIG. 5 omits illustrating a voltage exceeding 30 V. Note, however, that a voltage of 400 V is applied to the rectifier circuit. Because of the voltage of 400 V applied to the rectifier circuit, a transient current of approximately 26 A is generated.

Rectifier Circuit 1

In contrast, described below with reference to FIG. 3 is a transient current of the rectifier circuit 1. As seen in the comparative example, a reverse voltage of 400 V is also applied to the rectifier circuit 1. In the rectifier circuit 1, however, the transient current (a negative RCI) is approximately 13 A. As can be seen, FIG. 3 confirms that the rectifier circuit 1 can reduce the transient current further than the rectifier circuit in the comparative example does.

2. Effects of Reducing Loss

Described next is a relationship between transient current and loss. A transient current causes much loss in a high-resistance part of a path of the transient current. In the power source circuit 10, for example, the resistance of the switch element SST1 is highest of all the resistances of the elements. This is because, when the transient current flows, the switch element SST1 has not sufficiently transited to an ON state (i.e., a low resistance state; ideally, a state of 0M). When the transient current flows in the switch element SST, a loss occurs. Hence, the first embodiment introduces various techniques to reduce the amount of the transient current to effectively reduce the loss.

First to Fourth Improvements to Efficiently Operate Rectifier Circuit

Figure 6:
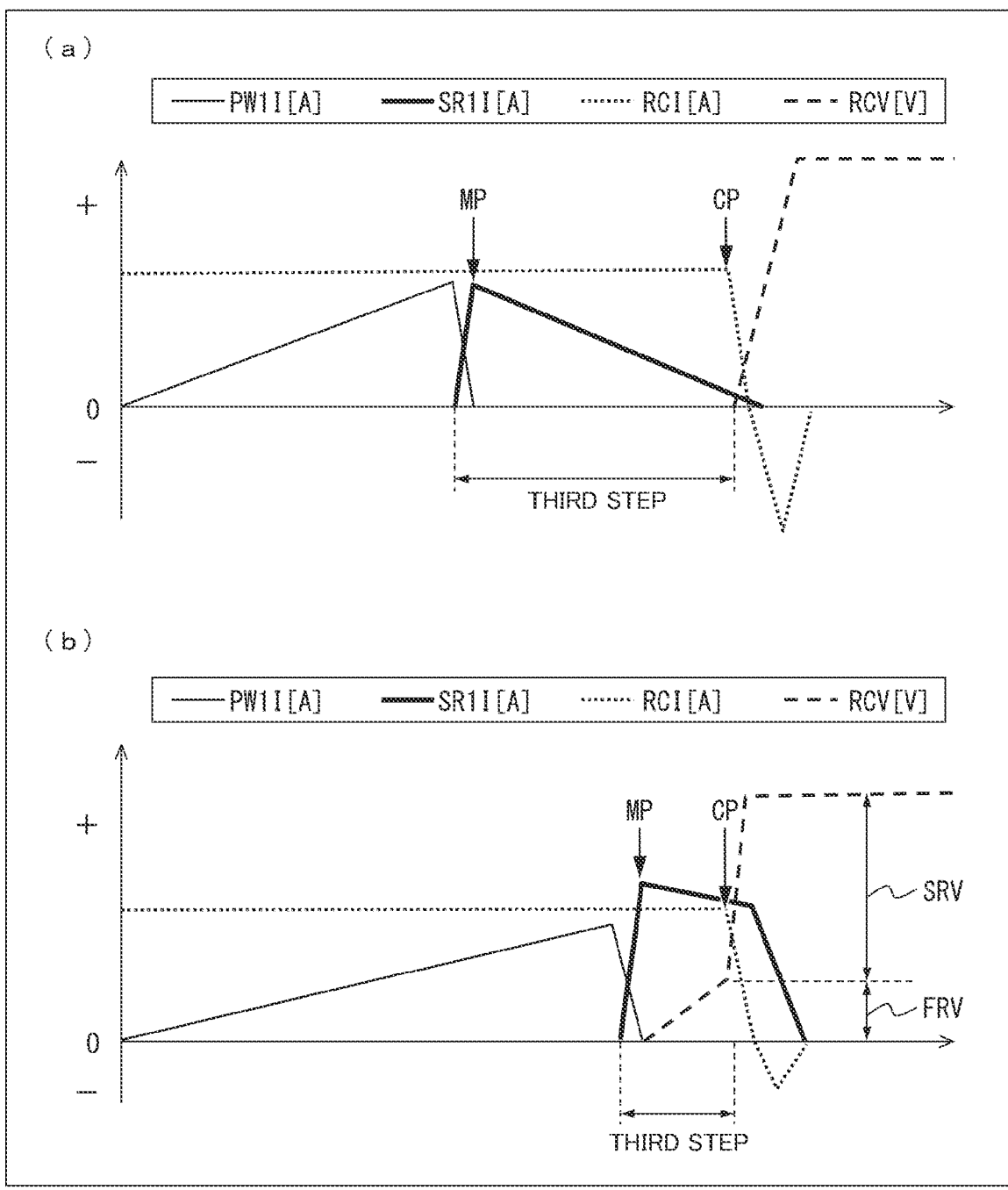
FIG. 6 is a set of diagrams in which a diagram (a) shows for a reference purpose an inappropriate operation of the rectifier circuit according to the first embodiment, and a diagram (b) shows improvements in the rectifier circuit.

The first embodiment introduces multiple preferable improvements. Described below are these preferable improvements. FIG. 6 shows graphs schematically illustrating waveforms of the above PW1I, SR1I, RCI, and RCV. In the graphs, the horizontal axis indicates a time scale, and the vertical axis indicates a voltage or a current. On the vertical axis, 0 denotes the zero level of the voltage or the current. The graphs in FIG. 6 illustrate the waveforms in and around the time period of the third step. The graphs in FIG. 6 are schematic graphs for illustrative purposes, and detailed values are omitted.

Figure 7:
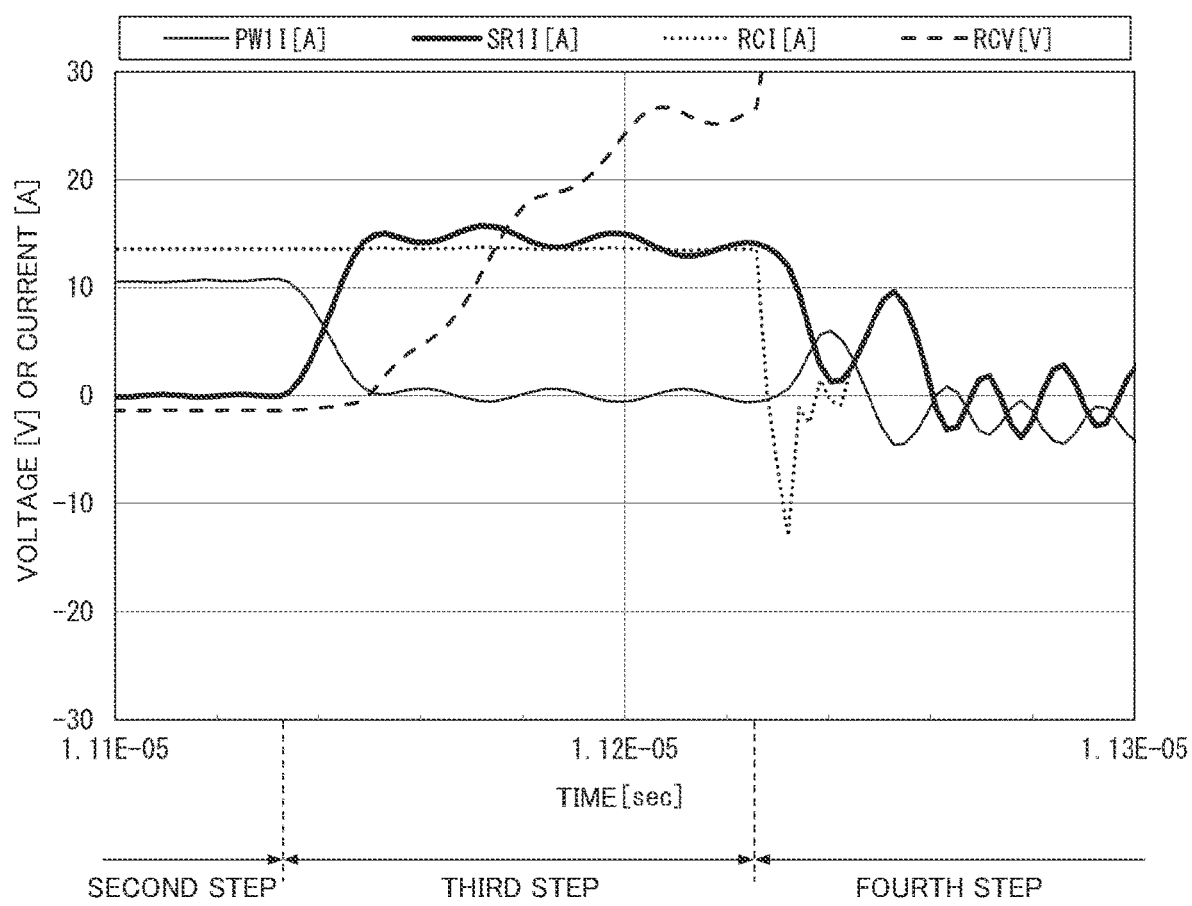
FIG. 7 is a diagram of waveforms in an actual operation of the rectifier circuit, according to the first embodiment, with the improvements in the diagram (b) in FIG. 6 achieved.

More specifically, the diagram (a) of FIG. 6 illustrates for reference purposes an inappropriate operation of the rectifier circuit 1. The diagram (a) of FIG. 6 collectively shows inappropriate factors in a single diagram. Whereas, the diagram (b) of FIG. 6 illustrates improvements in the rectifier circuit 1. FIG. 7 illustrates data in an actual operation of the rectifier circuit 1, with the improvements in the diagram (b) of FIG. 6 achieved. FIG. 7 shows on a larger scale the third step and steps before and after the third step illustrated in FIG. 3.

First Improvement: Increasing Value of Current in Second Rectifier

In the example of FIG. 6, a point MP denotes the highest value of the SR1I. In the example of the diagram (a) in FIG. 6, the value of the SR1I at the time point MP (i.e., the maximum value of the SR1I) is smaller than that of the RCI observed at the same time (the same time point). In this case, a parasitic capacitance of the first rectifier FR1 cannot be stored using the SR1I.

In contrast, in the example of the diagram (b) in FIG. 6, the value of the SR1I at the time point MP (i.e., the maximum value of the SR1I) is larger than that of the RCI observed at the same time point. In this case, a parasitic capacitance of the first rectifier FR1 can be stored using the SR1I. That is, the first reverse voltage can be applied. In the diagram (b) in FIG. 6, an FRV indicates a level to which the RCV initially rises. This FRV corresponds to the first reverse voltage.

The rectifier circuit 1 achieves the first improvement. Hence, as illustrated in FIG. 7, the first reverse voltage of approximately 25 V is applied in the first step (see, for example, the RCV applied at the end of the third step).

Second Improvement: Applying Second Reverse Voltage Following First Reverse Voltage In the example of the diagram (a) in FIG. 6, the second reverse voltage is applied with no first reverse voltage applied. Hence, a reverse voltage of 400 V is applied as the second reverse voltage.

In contrast, in the example of the diagram (b) in FIG. 6, the second reverse voltage is applied, following the application of the first reverse voltage (the FRV). Hence, the level of the second reverse voltage is the difference (the SRV) obtained when the first reverse voltage (the FRV) is subtracted from 400 V. This SRV corresponds to the second reverse voltage. The SRV, lower than 400 V, can reduce a transient current.

It can be difficult to specifically determine the time point at which the second reverse voltage is applied because of ringing of a parasitic component. In such a case, the specific time point can be determined, focusing on the variation in the RCI. Specifically, FIG. 6 shows that the RCI is drastically attenuated at a point CP. Such a drastic attenuation of the RCI is caused when the voltage to be applied to the rectifier circuit starts to vary. Hence, the time point of CP in FIG. 6 is interpreted as a time point when the second reverse voltage is applied.

The rectifier circuit 1 achieves the second improvement. Hence, the amount of the transient current (a negative RCI) is smaller in the examples of the diagram (b) in FIG. 6 and FIG. 7 than in the example of the diagram (a) in FIG. 6.

Third Improvement: Conduction Period of Second Rectifier is Shorter than Conduction Period of Primary Winding In the example of the diagram (a) in FIG. 6, a time period in which the second rectifier current (the SR1I) flows (a conduction period of the second rectifier SR1) is as long as that in which the primary winding current (the PW1I) flows (a conduction period of the primary winding PW1). The conduction period of the primary winding PW1 is to store magnetic energy, and thus is set relatively long. When a current flows in the second rectifier SR1 for a time period as long as the conduction period of the primary winding PW1, the flow causes a conductive loss.

In contrast, in the example of the diagram (b) in FIG. 6, the conduction period of the second rectifier SR1 is set shorter than that of the primary winding PW1. Hence, the short conduction period of the second rectifier SR1 contributes to reduction in the conductive loss.

Note, however, that if the conduction period of the second rectifier SR1 is shorter than 10 nsec, it is difficult to appropriately adjust a time point for the application of the second reverse voltage to the rectifier circuit 1. Hence, it should be noted that the conduction period of the second rectifier SR1 is set not to be shorter than 10 nsec. Still, preferably, the conduction period of the second rectifier SR1 is set sufficiently shorter than that of the primary winding PW1.

More specifically, in the rectifier circuit 1, the conduction period of the second rectifier SR1 is preferably as long as, or shorter than, half the conduction period of the primary winding PW1. Unlike the example of the diagram (a) in FIG. 6, the example of the diagram (b) in FIG. 6 shows that the conduction period of the second rectifier SR1 is set to achieve the third improvement. More preferably, the conduction period of the second rectifier SR1 is as long as, or shorter than, approximately one tenth the conduction period of the primary winding PW1.

The rectifier circuit 1 achieves the third improvement. In the example of FIG. 7, the conduction period of the primary winding PW1 is approximately 1.15 μsec, and the conduction period of the second rectifier SR1 is approximately 85 nsec. In this case, the conduction period of the second rectifier SR1 is approximately seven hundredth as long as the conduction period of the primary winding PW1.

Fourth Improvement: Secondary Winding is Formed into Fewer Turns than Primary Winding is In the example of the diagram (a) in FIG. 6, the SR1I is approximately the same in maximum value as the PW1I. In such a case, when the SR1I is increased to apply the first reverse voltage, the PW1I is inevitably increased together with the SR1I. This is because a relationship of N1×PW1I=N2×SR1I holds, taken into consideration a relationship between turns of the transformer TR1 and the flux linkage. Here, N1 is turns of the primary winding PW1, and N2 is turns of the secondary winding SW1. However, the PW1 does not have to be increased in particular. An unnecessary increase in the PW1 causes loss.

In contrast, in the example (b) of FIG. 6, the secondary winding is formed into fewer turns than the primary winding is. Such a feature makes it possible to increase the SR1I more than the PW1I. That is, the PW1I is reduced, making it possible to reduce conductive loss Meanwhile, the SR1I can be increased more than the SR1I.

The rectifier circuit 1 achieves the fourth improvement. Hence, as illustrated in FIG. 7, the SR1I is larger in maximum value than the PW1I. This is because N2 is smaller than N1 in the transformer TR1. As an example, N1 is nine and N2 is six as described above.

Note that, if a voltage of the secondary winding SW1 is constant when the N1 is increased, a voltage of the primary winding PW1 rises as the N1 increases. Hence, in order to keep the switch element TT1 from breaking down, it is not preferable to excessively increase the N1.

Thus, taking into consideration the performance of the switch TT1 (e.g., a transistor) currently on sale, the N1 is preferably fewer than, or equal to, three times the N2. Moreover, taking into consideration reduction in costs of the rectifier circuit 1, the N1 is more preferably fewer than, or equal to, twice the N2.

Applicable Range of First Reverse Voltage-1 In the example of the first embodiment, the FRV (the first reverse voltage) of approximately 25 V is used to reduce the transient current. In order to further reduce the transient current, a technique to be adopted in the example of diagram (b) in FIG. 6 is to further increase the FRV and to decrease the SRV (the second reverse voltage). Specifically, the first reverse voltage is raised higher so that the transient current can be reduced further.

Meanwhile, a parasitic capacitance (hereinafter Coss) of the first rectifier FR1 varies depending on a voltage (e.g., a reverse voltage) to be applied to the first rectifier FR1. Specifically, the Coss decreases when the reverse voltage is 200 V or lower. Moreover, voltage dependency of the Coss decreases when the reverse voltage is 200 V or higher. In contrast, the Coss increases when the reverse voltage is 50 V or lower. In particular, the Coss significantly increases when the reverse voltage is 5 V or lower.

Figure 8:
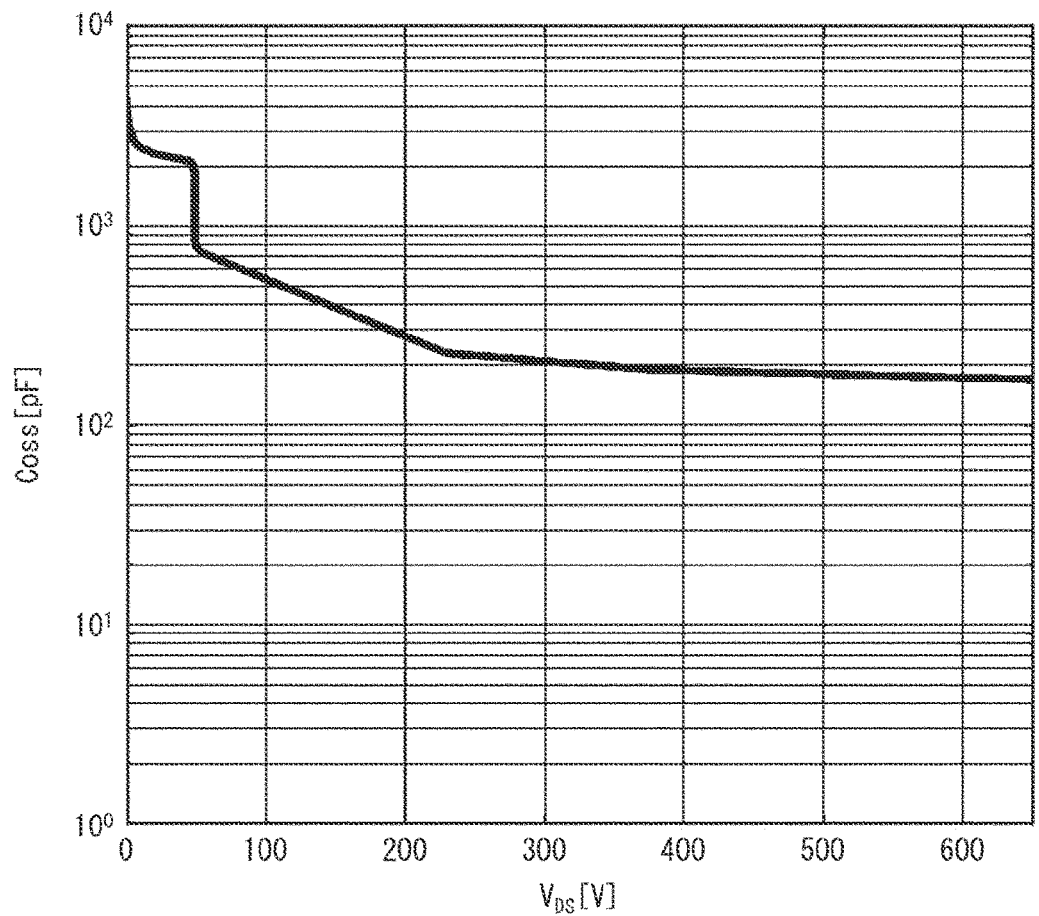
FIG. 8 is a diagram illustrating an example of voltage dependency of parasitic capacitance in a first rectifier.

FIG. 8 is a graph illustrating an example of voltage dependency of the Coss in the first rectifier FR1. The example of the voltage dependency of the Coss as described above is observed as illustrated in FIG. 8. The horizontal axis of the graph in FIG. 8 shows a drain-source voltage (hereinafter VDS) of the first rectifier FR1. Moreover, the vertical axis of the graph in FIG. 8 shows the Coss. The VDS is interpreted as a reverse voltage to be applied to the first rectifier FR1.

In view of the voltage dependency of the Coss as described above, the FRV is set at least to 5 V such that a significantly large Coss of 5 V or lower can be stored. Moreover, the FRV is set to 50 V such that, in addition to the significantly large Coss of 5V or lower, a large Coss ranging from 5 V to 50 V can also be stored.

Hence, the FRV is preferably a predetermined voltage value of 5 V or higher. Furthermore, when the FRV is set to 50 V or higher, the Coss can be stored in larger amount. In accordance with the storage amount, the SRV (the second reverse voltage) can be decreased, contributing to reduction in transient current.

Applicable Range of First Reverse Voltage-2

When the Coss is stored at a higher level of voltage, more magnetic energy is required. For example, when the Coss is stored up to 400 V, the problem is the loss caused by the current to be required in storing the Coss. Hence, the Coss should be stored within an appropriate range.

Figure 12:
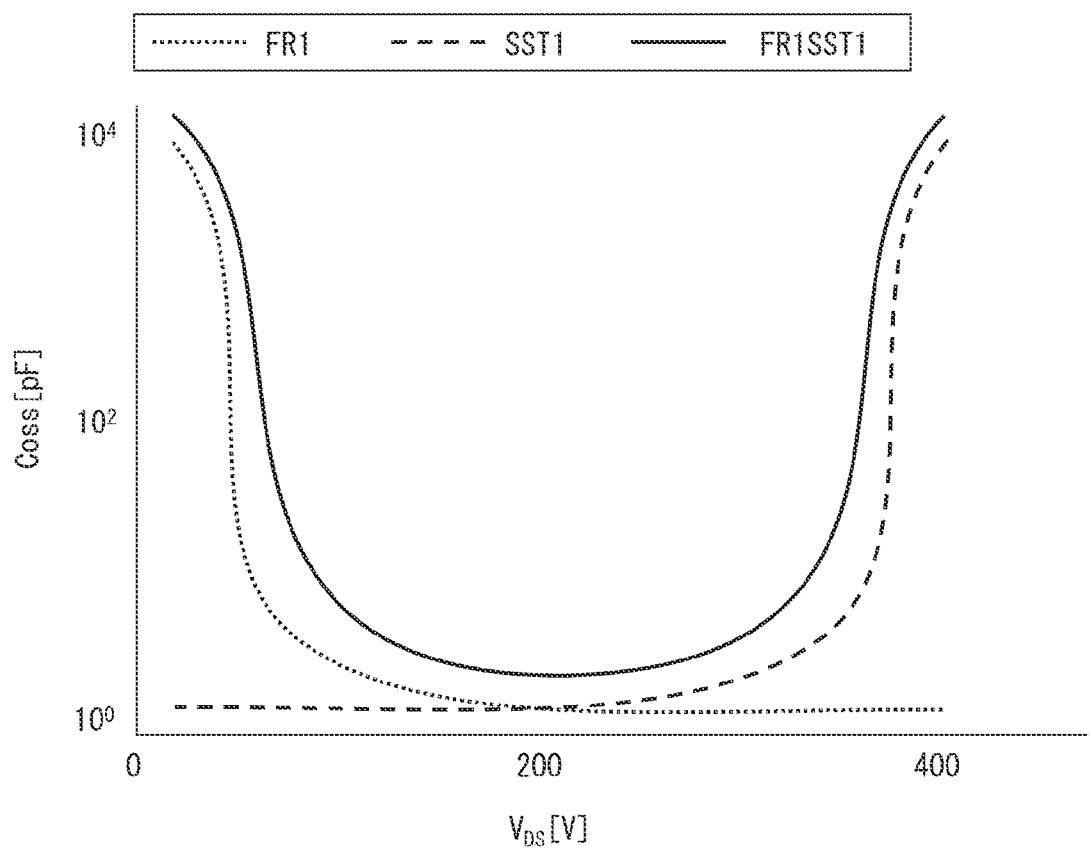
FIG. 12 is a diagram illustrating an example of voltage dependency of parasitic capacitance in elements.

This appropriate range will be described below, with reference to FIG. 12. FIG. 12 is a graph illustrating voltage dependency of a Coss in the elements. In the graph of FIG. 12, the horizontal axis indicates a VDS of the first rectifier FR1, and the vertical axis indicates a Coss of each element. The graph in FIG. 12 is illustrated schematically, and precise values are omitted. A reference sign "FR1" in FIG. 12 indicates a Coss of the first rectifier FR1. Moreover, the graph in FIG. 8 corresponds to the FR1 in FIG. 12.

A reference sign "SST1" in FIG. 12 indicates a Coss of the switch element SST1. The switch element SST1 is a GaN-HEMT as the first rectifier FR1 is, and can obtain the same value of the Coss as the first rectifier FR1 does. Note that, in FIG. 12, the SST1 is represented as a graph of the FR1 mirror-reversed with respect to a VDS of 200 V. This is because the voltage to be applied to the switch element SST1 is inverted with respect to a voltage to be applied to the first rectifier FR1. Specifically, when a 10-V-voltage of the first rectifier FR1 is applied to the switch element SST1, the voltage of the switch element SST1 falls from 400 V by 10 V. Hence, with respect to the VDS of 200 V, the graph of the FR1 is mirror-reversed. Hence, from the graph of the FR1, the graph of the SST1 can be obtained.

A reference sign "FR1SST1" in FIG. 12 indicates a Coss to be obtained as a sum of the Coss of SST1 and the Coss of the FR1 in each VDS. In the first embodiment, the Coss stored and released by the SR1I includes not only the Coss of the first rectifier FR1 but also the Coss of the switch element SST1. As illustrated in FIG. 12, the FR1SST1 is a graph symmetric with respect to a VDS of 200 V. The graph shows that, at the VDS of 200 V, the value of the FR1SST1 (the Coss) is minimum.

The energy to store the Coss is defined as $\frac{1}{2}CV^2$. Here, C is a Coss and V is a VDS. Hence, from 0 V to 200 V, the C decreases as the VDS increases. Hence, the Coss can be efficiently stored, eliminating the need of significantly additional energy for the storing. That is, the Coss can be efficiently stored up to 200 V.

When the VDS is in a range from 300 V to around 400 V, however, the Coss also increases significantly as the VDS rises. Such a high VDS requires significantly high energy for the storing, and thus is not efficient. Hence, the Coss is stored most preferably until the VDS reaches 200 V. That is, most preferably, the first reverse voltage is approximately 200 V.

A voltage of 400 V indicated in FIG. 12 is a reverse voltage to be continuously applied. The reverse voltage can be changed as appropriate in accordance with specifications of the circuit. The rectifier and the switch element each have a different Coss in value between the elements. However, their tendencies are substantially similar to each other, and the above idea is applicable.

In view of the above points, for example, the FRV (the first reverse voltage) is preferably within 50%±38% of the SRV (the second reverse voltage). That is, the FRV is preferably within 12% to 88% of the SRV. More specifically, the FRV is preferably higher than or equal to 12%, and lower than or equal to 88%, of the SRV. Moreover, the FRV is preferably within 50%±30% of the SRV. That is, the FRV is preferably within 20% to 80% of the SRV. More specifically, the FRV is preferably higher than or equal to 20%, and lower than or equal to 80%, of the SRV.

Moreover, the value of the first reverse voltage varies as time passes. The value of the first reverse voltage defined here is the one immediately before the second reverse voltage is applied. That is, the value of the first reverse voltage is a level of the RCV at the end of the third step.

How to Obtain Magnetic Energy Close to Secondary Winding

The above item "Additional Comments on Connection of Transformer TR1: Storing Magnetic Energy" has described how to store the magnetic energy in the transformer TR1. In order to efficiently store much magnetic energy in the transformer TR1, however, a combined use of two or more techniques is preferable. The first embodiment introduces another technique in addition to the technique described in the above item.

The other technique involves storing the magnetic energy in the transformer TR1 from the secondary winding SW1. Specifically, an amount (a level) of a voltage drop in the first rectifier FR1 caused by a flow of a forward current (i.e., a positive RCI) in the first rectifier FR1 may be greater than a forward voltage observed in the second rectifier SR1 when the second rectifier SR1 starts to conduct the second rectifier current SR1I (i.e., a forward voltage of the second rectifier SR1 observed when the second rectifier SR1 start to conduct the second rectifier current SR1I).

As an example, in the first embodiment, the forward voltage of the second rectifier SR1 at the start of the conduction is 0.9 V. In contrast, the amount of voltage drop in the first rectifier FR1 is approximately 1 V. Hence, the second rectifier SR1 receives a voltage higher than the forward voltage at the start of the conduction. That is, the second rectifier SR1 can be made conductive. Hence, the second rectifier SR1 and the secondary winding SW1 can pass a current.

Such a current is illustrated as the SR1I in FIG. 2. As illustrated in FIG. 2, an SR1I of approximately 3 A flows in the second half of the first step. Hence, from the beginning, the SR1I of approximately 2 A can be conducted at the start of the second step. This is because the magnetic energy has already been stored in the transformer TR1, using the secondary winding SW1.

Modification: Synchronous Rectification

In the rectifier circuit 1, the first rectifier FR1 can perform synchronous rectification. The synchronous rectification preferably starts after the rectifier circuit 1 conducts a rectifier circuit current (a rectification current). For example, the synchronous rectification preferably starts in a dead time of 50 nsec after the current flows in the rectifier circuit.

The synchronous rectification preferably ends before the current of the first rectifier FR1 decreases to 0 A. For example, the synchronous rectification preferably ends 50 nsec before the current of the first rectifier FR1 decreases to 0 A.

In a typical power source circuit (e.g., the power source circuit 10r), the timing of the synchronous rectification is determined in accordance with the timing when a rectification current flows. In contrast, in the rectifier circuit 1, a plurality of current paths are formed. Hence, preferably, the timing of the synchronous rectification is determined particularly in accordance with the timing when the current flows in the first rectifier FR1.

Modification: Adding Snubber Circuit

In the rectifier circuit 1 according to the first embodiment, a snubber circuit is omitted for the sake of simplicity. Note that, as a matter of course, a known snubber circuit may be provided to the rectifier circuit 1 as appropriate. An example of the snubber circuit may include an RC snubber circuit or an RCD snubber circuit. Alternatively, the snubber circuit may be an active snubber circuit (i.e., a snubber circuit including a transistor).

Modification: Scope in Application of Rectifier

The first embodiment shows as an example a case where the first rectifier FR1 is a cascode GaN-HEMT, and the second rectifier SR1 is an SiC-SBD. Note, however, that the first rectifier FR1 and the second rectifier SR1 may be of any given kind as long as these rectifiers are included in the scope of the rectifiers described above. Similarly, the switch element (e.g., the switch element TT1) may be of any given kind as long as the switch element functions as a switch.

An example of the first rectifier FR1 may be an FRD, or an SiC-SBD. Alternatively, an example of the second rectifier SR1 may be an FRD, or a GaN-HEMT. Use of a GaN-HEMT as the second rectifier SR1 makes it possible to perform synchronous rectification.

Second Embodiment

Figure 9:
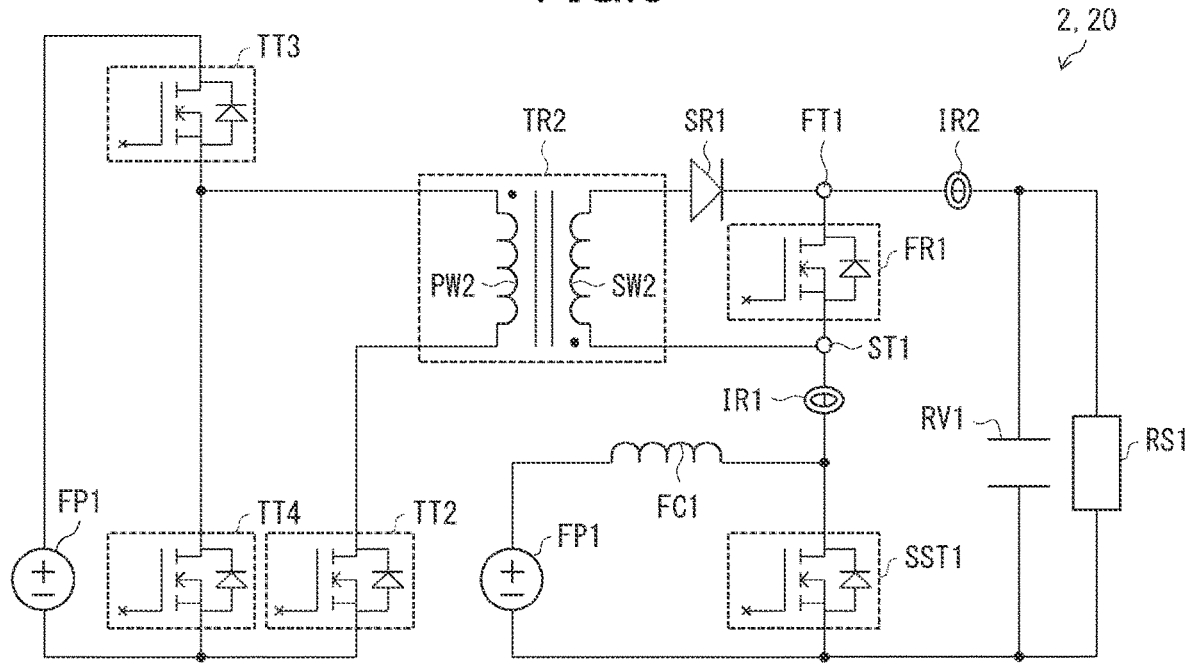
FIG. 9 is a circuit diagram of a power source circuit according to a second embodiment.

FIG. 9 is a diagram of a power source circuit 20 according to a second embodiment. A rectifier circuit according to the second embodiment is referred to as a rectifier circuit 2. In the rectifier circuit 2, the power source TP1 of the rectifier circuit 1 is replaced with an other power source FP1. That is, in the power source circuit 20, an input power source (the power source FP1) for a step-up chopper also serves as a power source for the rectifier circuit 2. Such a feature makes it possible to reduce the total number of the power sources in the power source circuit 20, contributing to reduction of costs.

Moreover, in the rectifier circuit 2, the switch element TT1 of the rectifier circuit 1 is replaced with switch elements TT2, TT3, and TT4. A transformer of the rectifier circuit 2 is referred to as a transformer TR2. In the transformer TR2, a primary winding and a secondary winding are respectively referred to as a primary winding PW2 and a secondary winding SW2. The rectifier circuit 2 is a modification of the rectifier circuit 1 whose circuitry to the primary winding is modified. The switch elements TT2 to TT4 are connected to the primary winding PW2. The switch elements TT2 to TT4 are similar to the switch element TT1. As necessary, parameters of the switch elements TT2 to TT4 may be revised.

The primary winding PW2 has an end with a black dot connected to a source of the switch element TT3 and to a drain of the switch element TT4. Whereas, the primary winding PW2 has an other end without a black dot connected to a drain of the switch element TT2. The power source FP1 has a positive electrode connected to a drain of the switch element TT3. Whereas, the power source FP1 has a negative electrode connected to sources of the respective switch elements TT2 and TT4.

Advantageous Effects of Rectifier Circuit 2

The rectifier circuit 2 in FIG. 9 is intended to prevent application of an excessively high voltage to a switch element connected to the primary winding. In the rectifier circuit 2, both of the switch elements TT2 and TT3 are turned ON to allow a current to flow in the primary winding PW2. When the current PW1I reaches a predetermined value, the switch element TT3 is turned OFF. After that, the switch element TT2 is turned OFF.

When a voltage is applied to the secondary winding SW2 with both of the switch elements TT2 and TT3 turned OFF, a voltage is generated in the primary winding PW2. Here, the switch element TT3 is OFF, making it possible to reduce the risk that a sum of the voltages of the primary winding PW1 and the power source FP1 is directly applied to the switch element TT2. As a result, the voltage to be applied to the switch element TT2 can be reduced substantially to the voltage of the primary winding PW2. Such a feature can prevent breakdown of the switch element TT2.

The rectifier circuit 2 does not necessarily include the switch element TT4. Note that, when the switch element TT4 operates complementarily to the switch element TT3, the three advantageous effects below can be achieved.

First, a bootstrap circuit can be used to supply power to drive the gate of the switch element TT3. The bootstrap circuit is inexpensive, contributing to reducing costs for supplying power to the gate.

Second, a voltage of a connection node between the switch elements TT3 and TT4 readily reaches 0 V. That is, the connection node can readily be grounded. The voltage of the connection node reaches 0 V when a return current due to leakage inductance of the primary winding PW2 flows in the switch element TT4 as a forward current.

Third, when the switch element TT4 is forced to turn ON, one of the terminals of the primary winding PW2 can be reliably grounded. Such a feature makes it possible to reliably maintain a voltage of the one terminal to 0 V.

Third Embodiment

Figure 10:
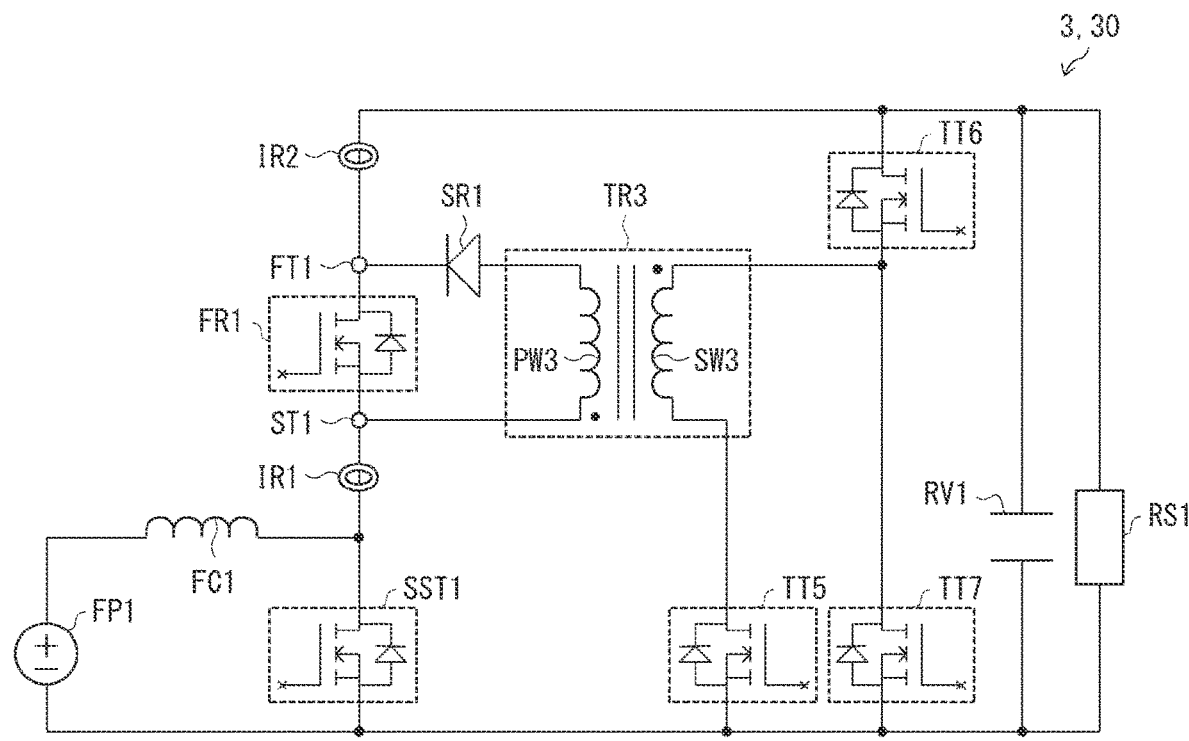
FIG. 10 is a circuit diagram of a power source circuit according to a third embodiment.

FIG. 10 is a circuit diagram of a power source circuit 30 according to a third embodiment. A rectifier circuit according to the third embodiment is referred to as a rectifier circuit 3. In the rectifier circuit 3, the power source TP1 of the rectifier circuit 1 is replaced with the capacitor RV1. That is, in the power source circuit 30, the smoothing capacitor (the capacitor RV1) of the step-up chopper can be used as the power source of the rectifier circuit 3. Such a feature makes it possible to reduce the total number of the power sources in the power source circuit 30, contributing to reduction of costs.

Moreover, in the rectifier circuit 3, the switch element TT1 of the rectifier circuit 1 is replaced with switch elements TT5, TT6, and TT7. A transformer of the rectifier circuit 3 is referred to as a transformer TR3. In the transformer TR3, a primary winding and a secondary winding are respectively referred to as a primary winding PW3 and a secondary winding SW3. The rectifier circuit 3 is also an other modification of the rectifier circuit 1 whose circuitry to the primary winding is modified. Hence, the rectifier circuit 3 may also be a modification of the rectifier circuit 2.

The switch element TT5 of the rectifier circuit 3 is similar in function to the switch element TT2 of the rectifier circuit 2. The switch elements TT6 and TT7 of the rectifier circuit 3 are respectively similar in function to the switch elements TT3 and TT4 of the rectifier circuit 2. The rectifier circuit 3 can also prevent breakdown of the switch element TT5, as the rectifier circuit 2 can.

Fourth Embodiment

A rectifier circuit according to an aspect of the present disclosure is applicable to any given power source circuit required to have a rectification function. Examples of the power source circuit include a step-up chopper circuit, a step-down chopper circuit, a bi-directional chopper circuit, an inverter circuit, a PFC circuit, and an insulated DC-DC converter.

Figure 11:
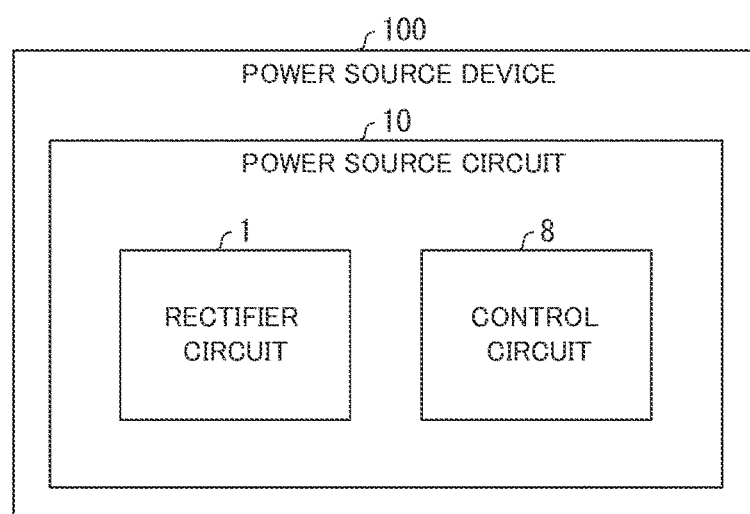
FIG. 11 is a diagram of a power source device according to a fourth embodiment.

FIG. 11 is a diagram of a power source device 100 including the power source circuit 10 (i.e., a power source circuit including the rectifier circuit 1). The rectifier circuit 1 can curb loss in the power source circuit 10 and the power source device 100. Moreover, the power source device 100 includes the control circuit 8. The control circuit 8 controls the units of the power source circuit 10. More specifically, the control circuit 8 causes the elements of the power source circuit 10 to selectively turn ON and OFF. The first to fourth steps may be executed by the control circuit 8 causing the elements of the power source circuit 10 to selectively turn ON and OFF.

Summary

A rectifier circuit according to a first aspect of the present disclosure includes a first terminal; and a second terminal. With reference to the first terminal, a positive voltage to be applied to the second terminal is a forward voltage. With reference to the second terminal, a positive voltage to be applied to the first terminal is a reverse voltage. If the forward voltage is continuously applied, a forward rectifier circuit current flows from the second terminal to the first terminal. If the reverse voltage is continuously applied, the forward rectifier circuit current is blocked. The rectifier circuit further includes: a first rectifier connected to the first terminal and the second terminal; a transformer including a primary winding and a secondary winding; a second rectifier connected in parallel to the first rectifier through the secondary winding; a switch element connected to the primary winding; and a power source connected to the primary winding. When the switch element is turned ON, a primary winding current flows from the power source to the primary winding. When the switch element is turned OFF, a second rectifier current flows from the secondary winding to the second rectifier. When the second rectifier current flows, a first reverse voltage is applied, the first reverse voltage being the reverse voltage applied instantaneously.

As can be seen, when the reverse voltage is applied to a typical rectifier circuit, a transient current is generated. This transient current causes loss in a power source circuit or a power source device. In order to reduce the loss due to the transient current, the transient current has to be reduced.

Thus, the inventor has found out the above features on the basis of the idea that generation of the reverse voltage using magnetic energy stored in the transformer contributes to reduction in generation of the transient current.

The above features make it possible to generate the first reverse voltage (an instantaneous reverse voltage) by the second rectifier current derived from magnetic energy. When this first reverse voltage is applied, no transient current is generated in the rectifier circuit. This is because when the first reverse voltage is applied, a current component as the transient current flows by the magnetic energy through an internal path including the secondary winding, the second rectifier, and the first rectifier. That is, the transient current is hardly generated in an external path of the rectifier circuit.

Such a feature is interpreted to be the same thing that no transient current is generated when the rectifier circuit is viewed as a single rectifier. Hence, the rectifier circuit according to an aspect of the present disclosure can effectively reduce the transient current.

In the rectifier circuit of the first aspect according to a second aspect of the present disclosure, at a time point when the second rectifier current reaches a maximum value, the second rectifier current is preferably larger in amount than the rectifier circuit current observed at the time point.

The above feature makes it possible to store parasitic capacitance of the first rectifier by a differential current between the second rectifier current and the rectifier circuit current. When the parasitic capacitance is stored as described above, the first reverse voltage can be generated.

In the rectifier circuit of the first aspect or the second aspect according to a third aspect of the present disclosure, following the application of the first reverse voltage, a second reverse voltage is preferably applied. The second reverse voltage is the reverse voltage applied continuously.

As can be seen, the first reverse voltage is an instantaneous reverse voltage derived from magnetic energy. Hence, it is difficult to continuously apply a reverse voltage with the first reverse voltage alone. Hence, the second reverse voltage is applied, following the application of the first reverse voltage. Such a feature makes it possible to continuously apply the reverse voltage.

In the rectifier circuit, of any one of the first to third aspect, according to a fourth aspect of the present disclosure, a conduction period of the second rectifier is preferably shorter than a conduction period of the primary winding.

As can be seen, the conduction period of the primary winding (a time period in which the primary winding conducts a primary winding current) is a period for storing an appropriate amount of magnetic energy in a transformer. Hence, the conduction period of the primary winding needs to be set to a certain length.

On the other hand, the conduction period of the second rectifier (a time period in which the secondary rectifier conducts a secondary rectifier current) is a period for releasing the stored magnetic energy from the transformer. Hence, unlike the conduction period of the primary winding, the conduction period of the secondary rectifier current does not have to be set long. As a matter of fact, if the conduction period of the second rectifier current were set long, unnecessary conductive loss would increase. Hence, the conduction period of the second rectifier current is set shorter than that of the primary winding. Such a feature makes it possible to reduce conductive loss.

In the rectifier circuit, of any one of the first to fourth aspect, according to a fifth aspect of the present disclosure, the secondary winding is preferably formed into fewer turns than the primary winding is.

Such a feature makes it possible to increase the second rectifier current while decreasing the primary winding current. Hence, the increase in the second rectifier current contributes to effective generation of the first reverse voltage. Moreover, the decrease in the primary winding current also contributes to reduction in conductive loss.

In the rectifier circuit, of any one of the first to fifth aspects, according to a sixth aspect of the present disclosure, after the first reverse voltage reaches a predetermined voltage value of 5 V or higher, a second reverse voltage is preferably applied. The second reverse voltage is the reverse voltage applied continuously.

Such a feature makes it possible to apply the second reverse voltage, followed by the application of the first reverse voltage whose level is 5V or higher. Hence, the feature contributes to efficient reduction of transient current.

In the rectifier circuit, of any one of the first to sixth aspects, according to a seventh aspect of the present disclosure, the first reverse voltage is preferably higher than or equal to 12%, and lower than or equal to 88%, of a second reverse voltage which is the reverse voltage applied continuously.

Such a feature makes it possible to apply the first reverse voltage when magnetic energy is effectively available. Hence, the feature contributes to efficient reduction of transient current.

In the rectifier circuit, of any one of the first to seventh aspects, according to an eighth aspect of the present disclosure, a level of a voltage drop in the first rectifier, caused by a flow of the forward rectifier circuit current in the first rectifier, is preferably greater than a level of a forward voltage observed in the second rectifier when the second rectifier starts to conduct the second rectifier current.

Thanks to the above feature, while a forward rectifier circuit current is flowing, the second rectifier receives a voltage higher than the forward voltage at the start of the conduction. That is, the second rectifier can be made conductive. Hence, the second rectifier and the secondary winding can conduct a current, making it possible to store magnetic energy in the secondary winding. This magnetic energy can be used for application of the first reverse voltage.

A power source device according to a ninth aspect of the present disclosure preferably includes the rectifier circuit according to any one of the first to eighth aspect.

Such a feature provides the same advantageous effects as the rectifier circuit according to an aspect of the present disclosure does.

A method according to a tenth aspect of the present disclosure is for driving a rectifier circuit. The rectifier circuit includes: a first terminal; and a second terminal. In the rectifier circuit, with reference to the first terminal, a positive voltage to be applied to the second terminal is a forward voltage. With reference to the second terminal, a positive voltage to be applied to the first terminal is a reverse voltage. If the forward voltage is continuously applied, a forward rectifier circuit current flows from the second terminal to the first terminal. If the reverse voltage is continuously applied, the forward rectifier circuit current is blocked. The rectifier circuit includes: a first rectifier connected to the first terminal and the second terminal; a transformer including a primary winding and a secondary winding, a second rectifier connected in parallel to the first rectifier through the secondary winding; a switch element connected to the primary winding; and a power source connected to the primary winding. The method includes: applying the forward voltage, so that the forward rectifier circuit current flows; turning the switch element ON after the applying the forward voltage, so that a primary winding current flows from the power source to the primary winding; turning the switch element OFF after the turning the switch element ON, so that a second rectifier current flows from the secondary winding to the second rectifier, and that a first reverse voltage is applied, the first reverse voltage being the reverse voltage applied instantaneously; and applying a second reverse voltage after the turning the switch element OFF, the second reverse voltage being the reverse voltage applied continuously.

Such a feature provides the same advantageous effects as the rectifier circuit according to an aspect of the present disclosure does.

Additional Remarks

An aspect of the present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present invention. Moreover, the technical aspects disclosed in each embodiment are combined to achieve a new technical feature.

CROSS-REFERENCE TO RELATED APPLICATION

The present application claims priority to Japanese Patent Application No. 2018-136200, filed on Jul. 19, 2018, the contents of which are incorporated herein by reference in its entirety.

The invention claimed is:

1. A rectifier circuit, comprising:
a first terminal; and a second terminal,
    with reference to the first terminal, a positive voltage to be applied to the second terminal being a forward voltage,
    with reference to the second terminal, a positive voltage to be applied to the first terminal being a reverse voltage,
    if the forward voltage is continuously applied, a forward rectifier circuit current flowing from the second terminal to the first terminal, and
    if the reverse voltage is continuously applied, the forward rectifier circuit current being blocked,
the rectifier circuit, further comprising:
    a first rectifier connected to the first terminal and the second terminal;
    a transformer including a primary winding and a secondary winding;
    a second rectifier connected in parallel to the first rectifier through the secondary winding;
    a switch element connected to the primary winding; and
    a power source connected to the primary winding,
when the switch element is turned ON, a primary winding current flowing from the power source to the primary winding,
when the switch element is turned OFF, a second rectifier current flowing from the secondary winding to the second rectifier, and
when the second rectifier current flows, a first reverse voltage being applied, the first reverse voltage being the reverse voltage applied instantaneously, wherein
at a time point when the second rectifier current reaches a maximum value,
the second rectifier current is larger in amount than the forward rectifier circuit current observed at the time point,
following the application of the first reverse voltage, a second reverse voltage is applied, the second reverse voltage being the reverse voltage applied continuously, and
the second rectifier current flows from after the switch element is turned OFF until immediately after the application of the second reverse voltage.

2. The rectifier circuit according to claim 1, wherein a conduction period of the second rectifier is shorter than a conduction period of the primary winding.

3. The rectifier circuit according to claim 1, wherein the secondary winding is formed into fewer turns than the primary winding is.

4. The rectifier circuit according to claim 1, wherein after the first reverse voltage reaches a predetermined voltage value of 5 V or higher, a second reverse voltage is applied, the second reverse voltage being the reverse voltage applied continuously.

5. The rectifier circuit according to claim 1, wherein the first reverse voltage is higher than or equal to 12%, and lower than or equal to 88%, of a second reverse voltage which is the reverse voltage applied continuously.

6. The rectifier circuit according to claim 1, wherein a level of a voltage drop in the first rectifier, caused by a flow of the forward rectifier circuit current in the first rectifier, is greater than a level of a forward voltage observed in the second rectifier when the second rectifier starts to conduct the second rectifier current.

7. A power source device comprising the rectifier circuit according to claim 1.

* * * * *